(12) United States Patent
Walker

(10) Patent No.: US 11,972,793 B2
(45) Date of Patent: Apr. 30, 2024

(54) INTEGRATED CIRCUIT DEVICE INCLUDING AN SRAM PORTION HAVING END POWER SELECT CIRCUITS

(71) Applicant: Mavagail Technology, LLC, San Jose, CA (US)

(72) Inventor: Darryl G. Walker, San Jose, CA (US)

(73) Assignee: Mavagail Technology, LLC, San Jose, CA (US)

( * ) Notice: Subject to any disclaimer, the term of this patent is extended or adjusted under 35 U.S.C. 154(b) by 65 days.

(21) Appl. No.: 17/738,306

(22) Filed: May 6, 2022

(65) Prior Publication Data

US 2023/0082215 A1  Mar. 16, 2023

Related U.S. Application Data

(60) Provisional application No. 63/244,442, filed on Sep. 15, 2021.

(51) Int. Cl.
| | | |
|---|---|---|
| *G11C 11/41* | (2006.01) | |
| *G11C 11/412* | (2006.01) | |
| *G11C 11/418* | (2006.01) | |
| *G11C 11/419* | (2006.01) | |

(52) U.S. Cl.
CPC .......... *G11C 11/419* (2013.01); *G11C 11/412* (2013.01); *G11C 11/418* (2013.01)

(58) Field of Classification Search
CPC ... G11C 11/419; G11C 11/412; G11C 11/418; G11C 11/413
See application file for complete search history.

(56) References Cited

U.S. PATENT DOCUMENTS

| | | |
|---|---|---|
| 5,764,564 A | 6/1998 | Frake et al. |
| 6,788,566 B1 | 9/2004 | Bhavnagarwala et al. |
| 6,804,143 B1 | 10/2004 | Hobson |
| 6,985,397 B2 | 1/2006 | Tokui et al. |
| 7,009,884 B2 | 3/2006 | Yaoi et al. |
| 7,038,282 B2 | 5/2006 | Tokui et al. |
| 7,203,118 B2 | 4/2007 | Yaoi et al. |
| 7,248,508 B1 | 7/2007 | Frederick |
| 7,315,603 B2 | 1/2008 | Iwase et al. |
| 7,324,368 B2 | 1/2008 | Wang et al. |
| 7,366,006 B2 | 4/2008 | Zhang |
| 7,372,758 B2 | 5/2008 | Yaoi et al. |
| 7,379,354 B2 | 5/2008 | Heinrich-Barna et al. |

(Continued)

OTHER PUBLICATIONS

U.S. Appl. No. 17/738,321, filed May 6, 2022.
(Continued)

*Primary Examiner* — Mohammed A Bashar

(57) ABSTRACT

An integrated circuit device that has improved write margin at low operating voltages is disclosed. The integrated circuit device can include an SRAM array that has end power select circuits that can include selection circuits that provide a controllable impedance path between a power supply potential and an array power line. A power supply detection circuit may provide an assist enable signal when a power supply potential is low enough that write assist is needed. A power control circuit may provide end power control signals to end power select circuits to selectively control an impedance path between a power supply potential and an array power line to provide an I-R drop to a selected memory cell. In this way, write margins may be improved at low operating voltages.

20 Claims, 10 Drawing Sheets

(56) References Cited

U.S. PATENT DOCUMENTS

| | | |
|---|---|---|
| 7,400,523 B2 | 7/2008 | Houston |
| 7,502,275 B2 | 3/2009 | Nii et al. |
| 7,515,489 B2 | 4/2009 | Wong |
| 7,570,525 B2 | 8/2009 | Nii et al. |
| 7,586,806 B2 | 9/2009 | Wong |
| 7,596,012 B1 | 9/2009 | Su et al. |
| 7,613,031 B2 | 11/2009 | Hanafi et al. |
| 7,613,050 B2 | 11/2009 | Braceras et al. |
| 7,613,052 B2 | 11/2009 | Van Winkelhoff et al. |
| 7,613,053 B2 | 11/2009 | van Winkelhoff et al. |
| 7,636,268 B1 | 12/2009 | Peng |
| 7,643,357 B2 | 1/2010 | Braceras et al. |
| 7,653,846 B2 | 1/2010 | Kim et al. |
| 7,660,150 B2 | 2/2010 | Mikan, Jr. et al. |
| 7,672,182 B2 | 3/2010 | Park et al. |
| 7,679,948 B2 | 3/2010 | Park et al. |
| 7,688,668 B2 | 3/2010 | Hold |
| 7,692,974 B2 | 4/2010 | Amirante et al. |
| 7,701,755 B2 | 4/2010 | Chen et al. |
| 7,733,686 B2 | 6/2010 | Clinton |
| 7,733,687 B2 | 6/2010 | Kengeri et al. |
| 7,738,283 B2 | 6/2010 | Wong |
| 7,742,326 B2 | 6/2010 | Houston |
| 7,817,481 B2 | 10/2010 | Adams et al. |
| 7,830,727 B2 | 11/2010 | Arsovski et al. |
| 7,835,217 B1 | 11/2010 | Su et al. |
| 7,839,704 B2 | 11/2010 | Murata |
| 7,852,661 B2 | 12/2010 | Liu |
| 7,852,700 B2 | 12/2010 | Akiyoshi |
| 7,864,600 B2 | 1/2011 | Mikan, Jr. et al. |
| 7,864,617 B2 | 1/2011 | Kenkare |
| RE42,145 E | 2/2011 | Hobson |
| 7,881,137 B2 | 2/2011 | Chen et al. |
| 7,898,875 B2 | 3/2011 | Tao et al. |
| 7,903,483 B2 | 3/2011 | Russell et al. |
| 7,924,650 B2 | 4/2011 | Cho et al. |
| 7,952,911 B2 | 5/2011 | Lee et al. |
| 7,961,500 B2 | 6/2011 | Shinozaki |
| 7,978,503 B2 | 7/2011 | Koike et al. |
| 7,978,554 B2 | 7/2011 | Kim et al. |
| 7,978,559 B2 | 7/2011 | Kim et al. |
| 7,986,571 B2 | 7/2011 | Arsovski et al. |
| 8,000,130 B2 | 8/2011 | Kushida |
| 8,004,907 B2 | 8/2011 | Russell et al. |
| 8,009,500 B2 | 8/2011 | Nii et al. |
| 8,018,788 B2 | 9/2011 | Jung et al. |
| 8,045,402 B2 | 10/2011 | Yeung |
| 8,059,482 B2 | 11/2011 | Russell et al. |
| 8,072,797 B2 | 12/2011 | Sachdev et al. |
| 8,120,975 B2 | 2/2012 | Kenkare et al. |
| 8,130,579 B2 | 3/2012 | Kumar et al. |
| 8,164,938 B2 | 4/2012 | Kuroda et al. |
| 8,164,964 B2 | 4/2012 | Chandra et al. |
| 8,218,376 B2 | 7/2012 | Seshadri et al. |
| 8,218,390 B2 | 7/2012 | Nii et al. |
| 8,233,337 B2 | 7/2012 | Arsovski et al. |
| 8,233,342 B2 | 7/2012 | Adams et al. |
| 8,243,541 B2 | 8/2012 | Cho et al. |
| 8,248,867 B2 | 8/2012 | Mikan, Jr. et al. |
| 8,259,486 B2 | 9/2012 | Kumar et al. |
| 8,279,687 B2 | 10/2012 | Adams et al. |
| 8,279,696 B2 | 10/2012 | Shinozaki |
| 8,295,099 B1 | 10/2012 | Yachareni et al. |
| 8,305,798 B2 | 11/2012 | Deng |
| 8,310,894 B1 | 11/2012 | Su et al. |
| 8,315,117 B2 | 11/2012 | Zhang et al. |
| 8,320,164 B2 | 11/2012 | Chuang et al. |
| 8,325,511 B2 | 12/2012 | Seshadri |
| 8,325,512 B2 | 12/2012 | Chuang et al. |
| 8,331,180 B2 | 12/2012 | Adams et al. |
| 8,339,876 B2 | 12/2012 | Chandra et al. |
| 8,345,504 B2 | 1/2013 | Chuang et al. |
| 8,355,276 B2 | 1/2013 | Idgunji et al. |
| 8,363,453 B2 | 1/2013 | Arsovski et al. |
| 8,363,484 B2 | 1/2013 | Chandra et al. |
| 8,379,436 B2 | 2/2013 | Kawasumi |
| 8,379,465 B2 | 2/2013 | Clinton et al. |
| 8,400,804 B2 | 3/2013 | Tang et al. |
| 8,411,518 B2 | 4/2013 | Janardan et al. |
| 8,427,896 B1 | 4/2013 | Agarwal et al. |
| 8,432,764 B2 | 4/2013 | Heymann et al. |
| 8,437,214 B2 | 5/2013 | Mikan et al. |
| 8,441,842 B2 | 5/2013 | Rachamadugu et al. |
| 8,441,874 B2 | 5/2013 | Sinha et al. |
| 8,450,778 B2 | 5/2013 | Chang et al. |
| 8,451,652 B2 | 5/2013 | Seikh et al. |
| 8,451,670 B2 | 5/2013 | Kolar et al. |
| 8,456,939 B2 | 6/2013 | Prabhat |
| 8,462,542 B2 | 6/2013 | Deng |
| 8,462,572 B2 | 6/2013 | Sharma et al. |
| 8,467,233 B2 | 6/2013 | Yu et al. |
| 8,472,271 B2 | 6/2013 | Dawson et al. |
| 8,483,003 B2 | 7/2013 | Maeda |
| 8,488,369 B2 | 7/2013 | Chandra et al. |
| 8,488,401 B2 | 7/2013 | Sasaki et al. |
| 8,498,143 B2 | 7/2013 | Deng |
| 8,503,221 B1 | 8/2013 | Hobson et al. |
| 8,514,611 B2 | 8/2013 | Nguyen et al. |
| 8,514,612 B2 | 8/2013 | Ishii et al. |
| 8,520,429 B2 | 8/2013 | Behrends et al. |
| 8,525,546 B1 | 9/2013 | Arsovski et al. |
| 8,526,256 B2 | 9/2013 | Ghosh et al. |
| 8,559,213 B2 | 10/2013 | Yang et al. |
| 8,570,791 B2 | 10/2013 | Liu |
| 8,582,387 B1 | 11/2013 | Su et al. |
| 8,582,389 B2 | 11/2013 | Gajjewar et al. |
| 8,588,004 B2 | 11/2013 | Chand Sk et al. |
| 8,593,890 B2 | 11/2013 | Adams et al. |
| 8,611,166 B2 | 12/2013 | Shinozaki |
| 8,625,333 B2 | 1/2014 | Rao et al. |
| 8,630,132 B2 | 1/2014 | Cheng et al. |
| 8,630,142 B2 | 1/2014 | Nii et al. |
| 8,634,263 B2 | 1/2014 | Kenkare et al. |
| 8,654,575 B2 | 2/2014 | Deng |
| 8,659,936 B2 | 2/2014 | Chuang et al. |
| 8,665,637 B2 | 3/2014 | Ishikura et al. |
| 8,665,658 B2 | 3/2014 | Chen |
| 8,687,437 B2 | 4/2014 | Kim et al. |
| 8,693,235 B2 | 4/2014 | Liaw |
| 8,693,237 B2 | 4/2014 | Jou et al. |
| 8,693,267 B2 | 4/2014 | Gupta et al. |
| 8,711,641 B2 | 4/2014 | Sim et al. |
| 8,724,373 B2 | 5/2014 | Garg et al. |
| 8,724,420 B2 | 5/2014 | Cheng et al. |
| 8,730,712 B2 | 5/2014 | Choi |
| 8,730,713 B2 | 5/2014 | Garg et al. |
| 8,743,581 B2 | 6/2014 | Tang et al. |
| 8,743,645 B2 | 6/2014 | Nii et al. |
| 8,743,649 B2 | 6/2014 | Sato |
| 8,755,239 B2 | 6/2014 | Holla et al. |
| 8,773,918 B2 | 7/2014 | Tanabe |
| 8,773,923 B2 | 7/2014 | Chen et al. |
| 8,773,924 B2 | 7/2014 | Roy et al. |
| 8,773,940 B2 | 7/2014 | Badrudduza |
| 8,804,406 B2 | 8/2014 | Rachamadugu et al. |
| 8,830,783 B2 | 9/2014 | Idgunji et al. |
| 8,848,461 B2 | 9/2014 | Chang et al. |
| 8,854,869 B2 | 10/2014 | Komatsu et al. |
| 8,861,290 B2 | 10/2014 | Zimmer et al. |
| 8,885,393 B2 | 11/2014 | Bhatia et al. |
| 8,885,429 B1 | 11/2014 | Van Winkelhoff et al. |
| 8,908,418 B2 | 12/2014 | Yabuuchi |
| 8,908,421 B2 | 12/2014 | Liaw |
| 8,913,456 B2 | 12/2014 | Badrudduza et al. |
| 8,923,078 B2 | 12/2014 | Lin et al. |
| 8,934,313 B2 | 1/2015 | Song et al. |
| 8,937,832 B2 | 1/2015 | Kitagawa et al. |
| 8,947,951 B2 | 2/2015 | Baeck et al. |
| 8,953,401 B2 | 2/2015 | Chen |
| 8,958,232 B2 | 2/2015 | Chang et al. |
| 8,958,237 B1 | 2/2015 | Yang et al. |
| 8,958,238 B2 | 2/2015 | Sharma et al. |
| 8,964,452 B2 | 2/2015 | Su et al. |
| 8,964,455 B2 | 2/2015 | Liaw |

(56) References Cited

U.S. PATENT DOCUMENTS

| | | |
|---|---|---|
| 8,964,490 B2 | 2/2015 | Chow et al. |
| 8,971,096 B2 | 3/2015 | Jung et al. |
| 8,971,097 B2 | 3/2015 | Ngo et al. |
| 8,976,574 B2 | 3/2015 | Ahmed et al. |
| 8,982,651 B2 | 3/2015 | Grover et al. |
| 8,988,949 B2 | 3/2015 | Hua et al. |
| 8,995,208 B2 | 3/2015 | Jung et al. |
| 9,007,815 B2 | 4/2015 | Liaw |
| 9,013,949 B2 | 4/2015 | Schreiber et al. |
| 9,019,751 B2 | 4/2015 | Jin et al. |
| 9,030,863 B2 | 5/2015 | Gulati et al. |
| 9,030,886 B2 | 5/2015 | Chen |
| 9,030,893 B2 | 5/2015 | Jung et al. |
| 9,036,427 B2 | 5/2015 | Van Winkelhoff et al. |
| 9,047,980 B2 | 6/2015 | Agarwal et al. |
| 9,053,975 B2 | 6/2015 | Komatsu et al. |
| 9,058,861 B2 | 6/2015 | Behrends et al. |
| 9,064,550 B2 | 6/2015 | Chang et al. |
| 9,070,432 B2 | 6/2015 | Hsieh et al. |
| 9,082,507 B2 | 7/2015 | Holla et al. |
| 9,087,607 B2 | 7/2015 | Adams et al. |
| 9,093,125 B2 | 7/2015 | Puckett et al. |
| 9,093,148 B2 | 7/2015 | Hatsuda |
| 9,093,176 B2 | 7/2015 | Wu et al. |
| 9,105,315 B2 | 8/2015 | Hold et al. |
| 9,105,326 B2 | 8/2015 | Chen et al. |
| 9,111,635 B2 | 8/2015 | Jung et al. |
| 9,117,510 B2 | 8/2015 | Yang et al. |
| 9,123,439 B2 | 9/2015 | Pilo |
| 9,129,707 B2 | 9/2015 | Lin et al. |
| 9,135,985 B2 | 9/2015 | Li et al. |
| 9,142,266 B2 | 9/2015 | Chen et al. |
| 9,153,304 B2 | 10/2015 | Kulkarni et al. |
| 9,159,415 B2 | 10/2015 | Cosemans |
| 9,172,371 B2 | 10/2015 | Arsovski et al. |
| 9,177,633 B2 | 11/2015 | Roy et al. |
| 9,183,922 B2 | 11/2015 | Yang et al. |
| 9,189,052 B2 | 11/2015 | Bhatia et al. |
| 9,202,555 B2 | 12/2015 | Jung et al. |
| 9,208,853 B2 | 12/2015 | Kolar et al. |
| 9,208,858 B1 | 12/2015 | Lin et al. |
| 9,208,860 B2 | 12/2015 | Ngo et al. |
| 9,208,900 B2 | 12/2015 | Sinangil et al. |
| 9,218,872 B1 | 12/2015 | Liaw |
| 9,218,873 B2 | 12/2015 | Nii et al. |
| 9,224,453 B2 | 12/2015 | Jin et al. |
| 9,224,455 B1 | 12/2015 | Seo et al. |
| 9,230,636 B2 | 1/2016 | Meinerzhagen et al. |
| 9,230,637 B1 | 1/2016 | Butt et al. |
| 9,236,113 B2 | 1/2016 | Holla et al. |
| 9,236,116 B1 | 1/2016 | Braceras et al. |
| 9,245,595 B2 | 1/2016 | Felix et al. |
| 9,245,602 B2 | 1/2016 | Joshi |
| 9,251,875 B1 | 2/2016 | Atallah et al. |
| 9,263,119 B2 | 2/2016 | Kobatake |
| 9,263,121 B2 | 2/2016 | Karl et al. |
| 9,269,424 B2 | 2/2016 | Kim et al. |
| 9,281,030 B2 | 3/2016 | Dubey et al. |
| 9,281,031 B2 | 3/2016 | Chang et al. |
| 9,281,311 B2 | 3/2016 | Wu et al. |
| 9,286,969 B2 | 3/2016 | Agarwal et al. |
| 9,293,192 B1 | 3/2016 | Wong |
| 9,299,395 B2 | 3/2016 | Kulkarni et al. |
| 9,299,418 B2 | 3/2016 | Nii et al. |
| 9,299,421 B1 | 3/2016 | Lien |
| 9,305,627 B2 | 4/2016 | Hatsuda |
| 9,305,633 B2 | 4/2016 | Grover et al. |
| 9,324,392 B1 | 4/2016 | Asenov et al. |
| 9,324,413 B2 | 4/2016 | Ko et al. |
| 9,324,415 B2 | 4/2016 | Katoch |
| 9,330,751 B2 | 5/2016 | Nagle et al. |
| 9,331,098 B2 | 5/2016 | Stuber et al. |
| 9,336,861 B1 | 5/2016 | Moharir |
| 9,336,863 B2 | 5/2016 | Jung et al. |
| 9,336,865 B1 | 5/2016 | Chu et al. |
| 9,349,437 B2 | 5/2016 | Singh et al. |
| 9,349,438 B2 | 5/2016 | Sano et al. |
| 9,355,694 B2 | 5/2016 | Kulkarni et al. |
| 9,355,710 B2 | 5/2016 | Gong et al. |
| 9,368,194 B2 | 6/2016 | Komatsu et al. |
| 9,374,072 B2 | 6/2016 | Hold et al. |
| 9,378,788 B2 | 6/2016 | Kolar et al. |
| 9,396,790 B1 | 7/2016 | Chhabra et al. |
| 9,396,795 B1 | 7/2016 | Jeloka et al. |
| 9,411,391 B2 | 8/2016 | Bhatia et al. |
| 9,411,392 B2 | 8/2016 | Bhatia et al. |
| 9,418,759 B2 | 8/2016 | Badereddine et al. |
| 9,424,910 B2 | 8/2016 | Yabuuchi |
| 9,431,096 B1 | 8/2016 | Fritsch et al. |
| 9,437,281 B2 | 9/2016 | Hsieh et al. |
| 9,449,656 B2 | 9/2016 | Huang et al. |
| 9,449,661 B2 | 9/2016 | Chen et al. |
| 9,449,663 B2 | 9/2016 | Yang et al. |
| 9,449,669 B2 | 9/2016 | Luan et al. |
| 9,449,680 B2 | 9/2016 | Huang |
| 9,455,022 B2 | 9/2016 | Yabuuchi et al. |
| 9,455,025 B2 | 9/2016 | Wu et al. |
| 9,455,028 B1 | 9/2016 | Sahu |
| 9,460,771 B2 | 10/2016 | Luan et al. |
| 9,460,776 B2 | 10/2016 | Dally |
| 9,466,536 B2 | 10/2016 | Goktepeli et al. |
| 9,478,507 B2 | 10/2016 | Stuber |
| 9,484,096 B1 | 11/2016 | Chen et al. |
| 9,490,007 B1 | 11/2016 | Chan et al. |
| 9,490,008 B1 | 11/2016 | Moharir |
| 9,490,760 B2 | 11/2016 | Wang et al. |
| 9,496,020 B2 | 11/2016 | Luan et al. |
| 9,496,025 B2 | 11/2016 | Chandra et al. |
| 9,496,027 B2 | 11/2016 | Rim et al. |
| 9,496,028 B2 | 11/2016 | Nii et al. |
| 9,508,414 B2 | 11/2016 | Riley |
| 9,508,420 B1 | 11/2016 | Hunt-Schroeder et al. |
| 9,508,729 B2 | 11/2016 | Liaw |
| 9,530,796 B2 | 12/2016 | Stuber et al. |
| 9,542,992 B2 | 1/2017 | Lin et al. |
| 9,542,998 B1 | 1/2017 | Akhilesh et al. |
| 9,548,090 B2 | 1/2017 | Arita et al. |
| 9,548,104 B1 | 1/2017 | Braceras et al. |
| 9,548,106 B1 | 1/2017 | Sano et al. |
| 9,564,198 B2 | 2/2017 | Luan et al. |
| 9,564,211 B2 | 2/2017 | Liaw |
| 9,564,441 B2 | 2/2017 | Luan et al. |
| 9,570,156 B1 | 2/2017 | Braceras et al. |
| 9,576,623 B2 | 2/2017 | Jung et al. |
| 9,576,644 B2 | 2/2017 | Liaw |
| 9,576,646 B2 | 2/2017 | Wong |
| 9,583,178 B2 | 2/2017 | Jung et al. |
| 9,583,180 B2 | 2/2017 | Holst |
| 9,940,999 B2 | 4/2018 | Walker |
| 10,403,384 B2 | 9/2019 | Walker |
| 11,368,016 B2 | 6/2022 | Walker |
| 11,381,235 B2 | 7/2022 | Walker |
| 2023/0081549 A1 | 3/2023 | Walker |

OTHER PUBLICATIONS

Karl et al., A 0.6V, 1.5 GHZ 84 Mb SRAM in 14 nm FinFET CMOS Technology With Capactive Charge-Sharing Write Assist Circuitry, IEEE Journal of Solid-State Circuits, vol. 51, No. 1, Jan. 2016, pp. 222-229.

Keane et al., 5.6Mb/mm2 1R1W 8T SRAM Arrays Operating down to 560mV Utilizing Small-Signal Sensing with Charge-Shared Bitline Asymmetric Sense Amplifier in 14nm FinFET CMOS Technology, 2016 IEEE International Solid-State Circuits Conference, Feb. 3, 2016, pp. 308-310.

Qazi et al., Challenges and Directions for Low-Voltage SRAM, IEEE Design & Test of Computers, Jan./Feb. 2011, pp. 32-43.

Sinangil et al., A 28 nm 2 Mbit 6 T SRAM With Highly Configurable Low-Voltage Write-Ability Assist Implementation and Capacitor-Based Sense-Amplifier Input Offset Compensation, IEEE Journal of Solid-State Circuits, vol. 51, No. 2, Feb. 2016, pp. 557-567.

(56) References Cited

OTHER PUBLICATIONS

Song et al., A 14nm FinFET 128Mb 6T SRAM with Vmin-Enhancement Techniques for Low-Power Applications, 2014 IEEE International Solid-State Circuits Conference, Feb. 11, 2014, pp. 232-233.

Ueda et al., Ultra-Low Voltage (0.1V) Operation of Vth Self-Adjusting MOSFET and SRAM Cell, 2014 Symposium on VLSI Technology Digest of Technical Papers, 2014.

Yabuuchi et al., 20nm High-Density Single-Port and Dual-Port SRAMs with Wordline-Voltage-Adjustment System for Read/Write Assists, 2014 IEEE International Solid-State Circuits Conference, Feb. 11, 2014, pp. 234-235.

Song et al., A 3nm Gate-All-Around SRAM Featuring an Adaptive Dual-BL and an Adaptive Cell-Power Assist Circuit, 2021 IEEE International Solid-State Circuits Conference, Feb. 18, 2021, pp. 337-339.

Ryckaert et al., Enabling Sub-5nm CMOS Technology Scaling Thinner and Taller!, 2019 IEEE International Electron Devices Meeting (IEDM), Dec. 7-11, 2019.

Sung et al., Voltage Transfer Characteristic Matching by Different Nanosheet Layer Numbers of Vertically Stacked Junctionless CMOS Inverter for SoP/3D-ECs applications, 2018 IEEE International Electron Devices Meeting (IEDM), Dec. 1-5, 2018.

Bae et al., 3nm GAA Technology featuring Multi-Bridge Channel FET for Low Power and High Performance Applications, 2018 IEEE International Electron Devices Meeting (IEDM), Dec. 1-5, 2018.

Vardhan et al., Threshold Voltage Variability in Nanosheet GAA Transistors, IEEE Transactions on Electron Devices, vol. 68, No. 10, Oct. 2019, pp. 4433-4438.

Bao et al., Multiple-Vt Solutions in Nanosheet Technology for High Performance and Low Power Applications, 2019 IEEE International Electron Devices Meeting (IEDM), Dec. 7-11, 2019.

Barraud et al., Performance and Design Considerations for Gate-All-Around Stacked-NanoWires FETs (slides), 2017 IEEE International Electron Devices Meeting (IEDM), Dec. 2017.

Ye et al., The Nanosheet Transistor Is the Next (and Maybe Last) Step in Moore's Law, IEEE Spectrum, Jul. 30, 2019.

U.S. Appl. No. 63/244,442, filed Sep. 15, 2021, to which the present application claims priority.

U.S. Appl. No. 63/244,442, filed Sep. 15, 2021, Walker.

1 U.S. Appl. No. 17/738,321 Office Action, dated Nov. 9, 2023.

INTEGRATED CIRCUIT DEVICE INCLUDING AN SRAM PORTION HAVING END POWER SELECT CIRCUITS

This application claims the benefit of U.S. Provisional Patent Application Ser. No. 63/244,442, filed Sep. 15, 2021, the contents of which are incorporated by reference herein.

TECHNICAL FIELD

The present invention relates generally to a semiconductor device, and more particularly to improving efficient and reliable operation at low voltages of a static random access memory (SRAM) integrated circuit device.

BACKGROUND OF THE INVENTION

A static random access memory (SRAM) device may have difficulty reliably writing data when operating at various power supply potentials.

In light of the above, it would be desirable to provide a method of improving the reliability of writing data to an SRAM memory cell over a wide range of operating conditions including power supply voltage levels.

DETAILED DESCRIPTION OF THE EMBODIMENTS

According to the embodiments set forth below, an integrated circuit device can include an SRAM array that has end power select circuits that can include selection circuits that provide a controllable impedance path between a power supply potential and an array power line. A power supply detection circuit may provide an assist enable signal when a power supply potential is low enough that write assist is needed. A power control circuit may provide end power control signals to end power select circuits to selectively control an impedance path between a power supply potential and an array power line to provide an I-R drop to a selected memory cell. In this way, write margins may be improved at low operating voltages. The integrated circuit device may include a processor circuit with on die SRAM.

Figure 1:
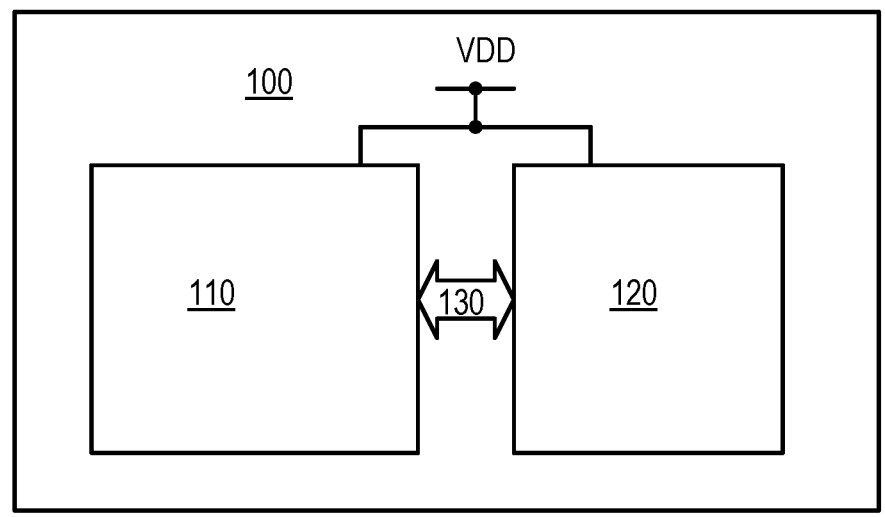
FIG. 1 is a block schematic diagram of an integrated circuit device according to an embodiment.

Referring now to FIG. 1, an integrated circuit device according to an embodiment is set forth in a block schematic diagram and given the general reference character 100.

Integrated circuit device 100 may include a processor circuit portion 110 and a static random access memory (SRAM) circuit portion 120. Processor circuit portion 110 and SRAM circuit portion 120 may be powered by power supply potential VDD. Power supply potential VDD may be provided from external to integrated circuit device 100.

Processor circuit portion 110 may transmit and receive data to/from SRAM circuit portion 120 along a bus 130. Bus 130 may also be used to transmit command signals from processor circuit portion 110 to SRAM circuit portion 120. Examples of commands may be a read command and/or a write command. A read command may be used to receive data from SRAM circuit portion 120 that is stored in one or more SRAM memory cells and a write command may be used to provide data to SRAM circuit 120 to be stored in one or more SRAM memory cells. Processor circuit portion 110 may use data from SRAM circuit portion 120 for operational or computational purposes.

It may be desirable to operate processor circuit portion 110 and SRAM circuit portion 120 using the same power supply potential VDD. In this way, the same process node may be used and design complications of providing more than one power supply potential can be avoided, which also may decrease the package footprint of semiconductor device and system level design complications.

According to an embodiment, SRAM circuit portion 120 may have assist circuitry and techniques to improve data write margins. In this way power supply potential VDD may be shared with both processor circuit portion 110 and SRAM circuit portion 120.

SRAM circuit portion 120 and processor circuit portion 110 may be formed on one contiguous device, such as an integrated circuit formed on a chip on a contiguous wafer to be separated by a dicing technique to form a device, such as a semiconductor device forming integrated circuit device 100.

Figure 2:
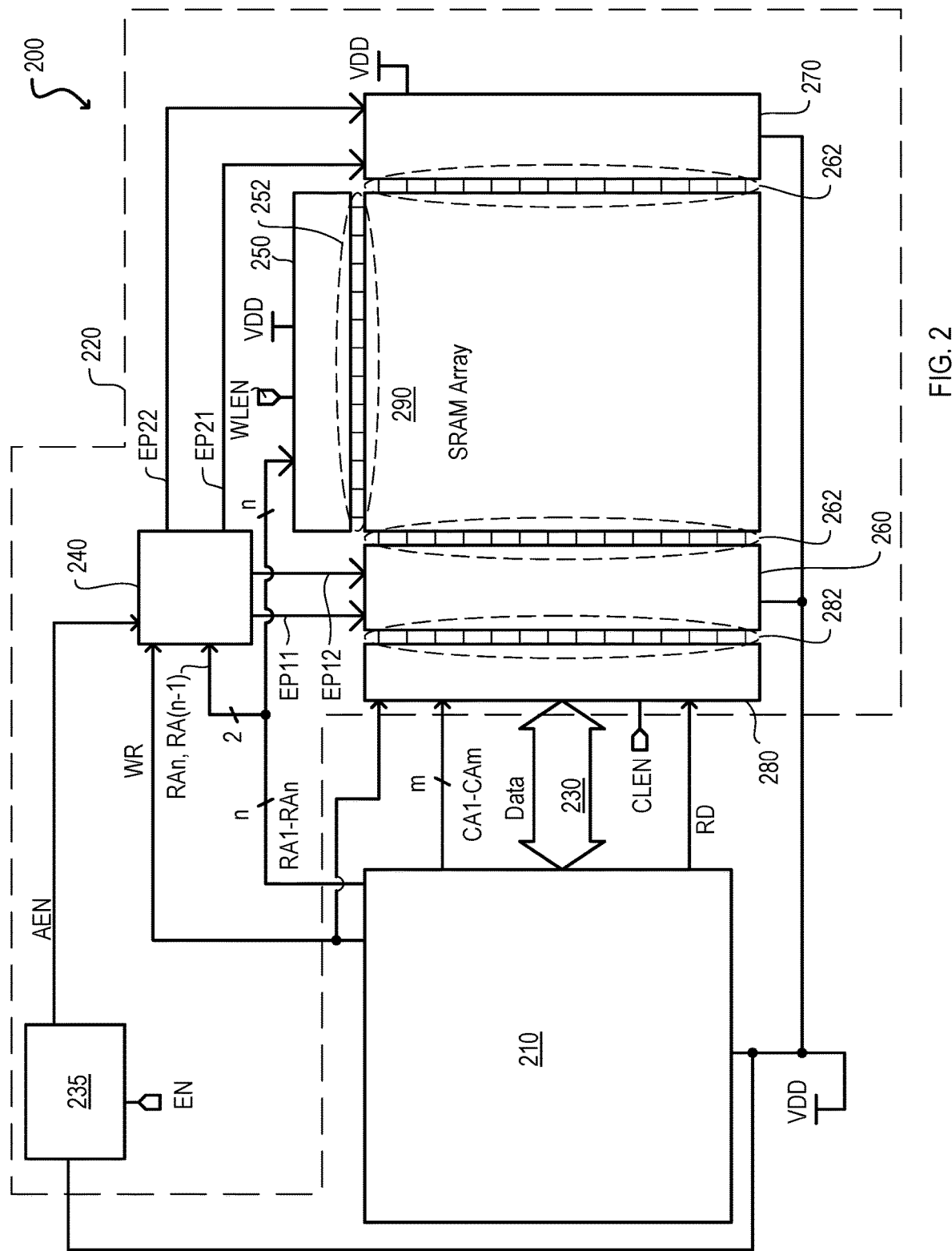
FIG. 2 is a block schematic diagram of an integrated circuit device according to an embodiment.

Referring now to FIG. 2, a more detailed schematic diagram of an integrated circuit device according to an embodiment is set forth in a block schematic diagram and given the general reference character 200.

Integrated circuit device 200 can include similar constituents as integrated circuit device 100 and such constituents may have the same reference character except beginning with a "2" instead of a "1".

Integrated circuit device 200 of FIG. 2 includes processor circuit portion 210 and SRAM circuit portion 220. Processor circuit portion 210 and SRAM circuit portion 220 may commonly receive power supply potential VDD. Power supply potential VDD may be provided external from integrated circuit device 200.

Processor circuit portion 210 may provide control and address signals to SRAM circuit portion. Such control and address signals may include a write signal WR, read signal RD, row address signals (RA1-RAn), and column address signals (CA1 to CAm), where n and m are integers. SRAM circuit portion 220 may operate as to receive or provide data on a data bus 230 from or to processor circuit portion 210. In this way, processor instructions and/or data may be received and provided between processor circuit portion 210 and SRAM circuit portion 220.

SRAM circuit portion 220 may include an SRAM array 290, a power supply level detection circuit 235, an array power control circuit 240, a row decoder circuit 250, end power select circuits (260 and 270), and a data interface circuit 280.

Power supply level detection circuit 235 may receive an enable signal EN and power supply potential VDD and may provide an assist enable signal AEN. When enable signal EN is at an enable logic level (logic high), power supply detection circuit 235 may provide assist enable signal AEN having a logic high (assist enable logic level) in response to the power supply potential VDD being below an assist potential Vassist and power supply detection circuit 235 may provide assist enable signal AEN having a logic low (assist disable logic level) in response to the power supply potential VDD being above an assist potential Vassist. When enable signal is at a disable logic level (logic low), power supply level detection may provide assist enable signal AEN at a logic high (assist enable level).

Array power control circuit 240 may receive assist enable signal AEN, write signal WR, and row address bits (RAn, RA(n−1)). Row address bits (RAn, RA(n−1)) may be the two most significant row address bits received by row decoder circuit 250. Array power control circuit 270 may provide end power control signals (EP11, EP12, EP21, and EP22) as outputs.

Row decoder circuit 250 may receive row address signals RA1-RAn, a word line enable signal WLEN, and power supply potential VDD and may provide a word line signal on each word line of a plurality of word lines 252. Only one of the plurality of word lines 252 may be active at a given time.

End power select circuit 270 may receive power supply potential VDD and end power select signals (EP21 and EP22). End power select circuit 260 may receive power supply potential VDD and end power select signals (EP21 and EP22). Data interface circuit 280 may receive column address signals (CA1-CAm) to operate a column selection circuit portion of end data interface circuit 280. Data interface circuit 280 may receive write signal WR and a read signal RD to operate a data read/write portion of data interface circuit 280. Data interface circuit 280 may be electrically connected to SRAM array 290 through a plurality of bit lines 282.

End power select circuits (260 and 270) may provide write assistance based on a location of a selected word line of the plurality of word lines 252 by providing a power supply potential VDD from a predetermined end of the SRAM array 290 and by selecting a particular impedance path to modify an impedance between the power supply potential VDD and the SRAM array 290.

End power select circuit (260 and 270) may be electrically connected to SRAM array 290 along array power supply lines 262. Array power supply lines 262 may be parallel to bit lines 282 across the SRAM array 290.

Processor circuit portions (110 and 210) and SRAM circuit portions (120 and 220) of integrated circuit device (100 and 200), respectively, may include a plurality of insulated gate field effect transistors (IGFETs). Each IGFET may include a control gate that may surround a plurality of horizontally disposed channel regions that can be vertically aligned above a substrate.

A description of the plurality of transistors on integrated circuit devices (100 and 200) will now be discussed with reference to FIGS. 3A to 3C.

Figure 3A:
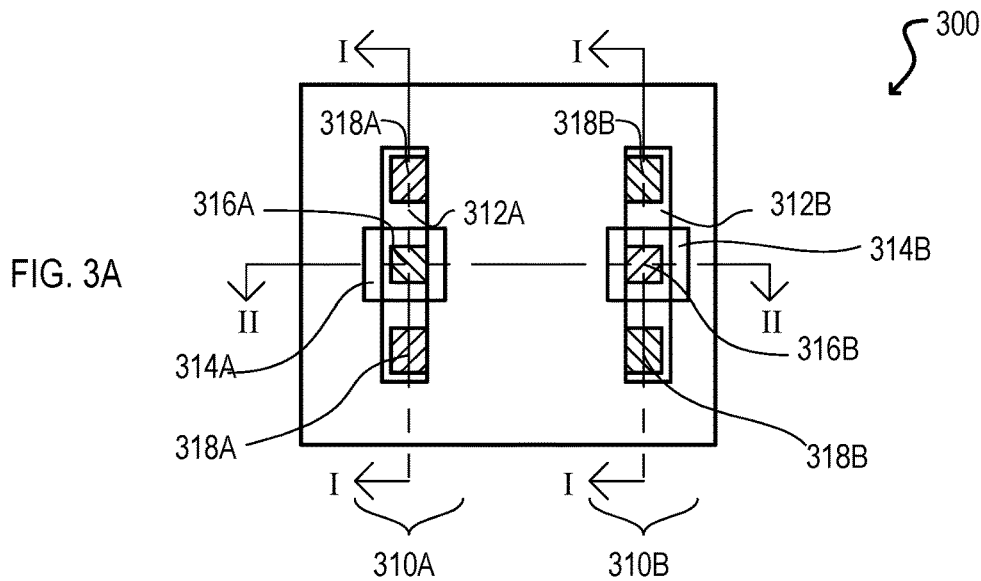
FIG. 3A is a top plan view of an integrated circuit device including transistors according to an embodiment.

Referring now to FIG. 3A, a top plan view of an integrated circuit device including transistors according to an embodiment is set forth and given the general reference character 300.

Integrated circuit device 300 may include an N-type insulated gate field effect transistor (IGFET) 310A and a P-type IGFET 310B.

N-type IGFET 310A and P-type IGFET 310B may each include a control gate that may surround a plurality of horizontally disposed channel regions that can be vertically aligned above a substrate.

N-type IGFET 310A may include drain/source contacts 318A, a gate contact 316A, a gate structure 314A, and vertically aligned and horizontally disposed channel region structures 312A.

P-type IGFET 310B may include drain/source contacts 318B, a gate contact 316B, a gate structure 314B, and vertically aligned and horizontally disposed channel region structures 312B.

Figure 3B:
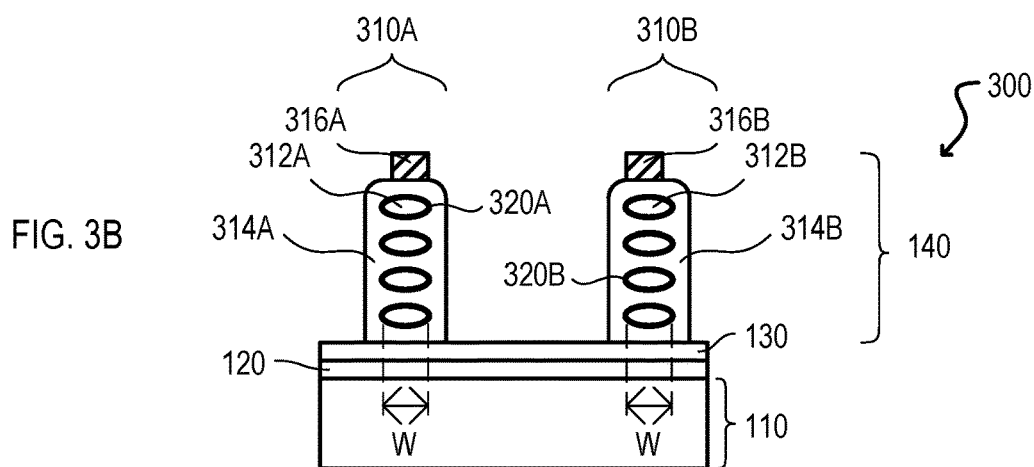
FIG. 3B is a cross sectional view of an integrated circuit device including transistors according to an embodiment.

Referring now to FIG. 3B, a cross sectional view of integrated circuit device 300 according to an embodiment is set forth. The cross-sectional view is along the line II-II of FIG. 3A.

Integrated circuit device 300 may include a N-type IGFET 310A, and a P-type IGFET 310B.

N-type IGFET 310A may include a gate contact 316A, a gate structure 314A, and vertically aligned and horizontally disposed channel regions 312A, and gate insulating layer 320A. Gate insulating layer 320A may surround each vertically aligned and horizontally disposed channel regions 312A.

P-type IGFET 310B may include a gate contact 316B, a gate structure 314B, and vertically aligned and horizontally disposed channel regions 312B, and gate insulating layer 320B. Gate insulating layer 320B may surround each vertically aligned and horizontally disposed channel regions 312B.

Gate structures (314A and 314B) are each contiguous gate structures that surround channel regions (312A and 312B), respectively.

Figure 3C:
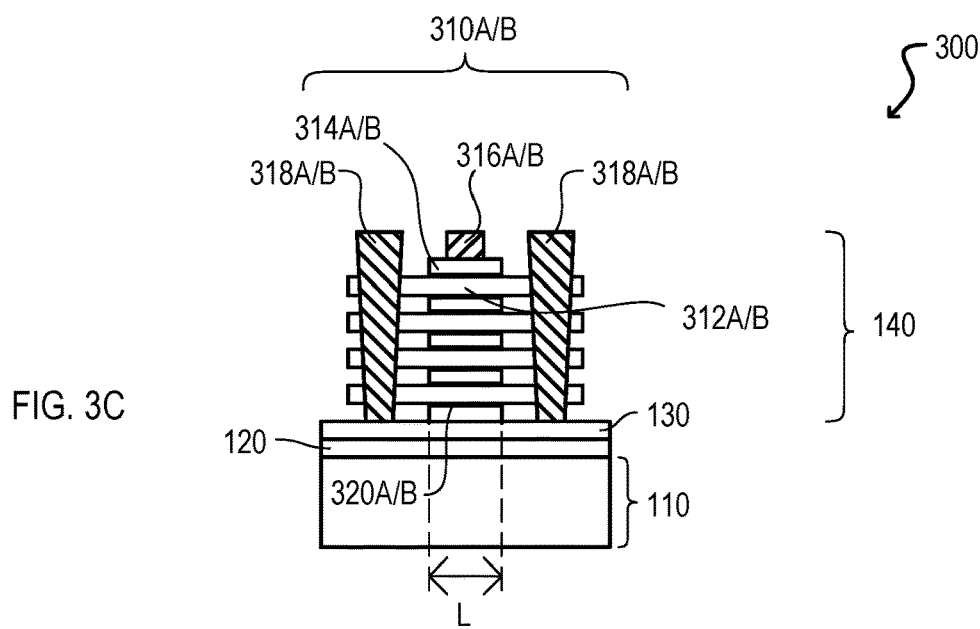
FIG. 3C is a cross sectional view of an integrated circuit device including transistors according to an embodiment.

Referring now to FIG. 3C, a cross sectional view of integrated device 300 is set forth. The cross-sectional view is along the line I-I of FIG. 3A. As shown in FIG. 3A, there are two lines I-I as the N-type IGFET 310A and P-type IGFET 310B may have similar structures except the materials and/or doping of materials may differ and elements are designated with the suffix "A/B" to illustrate such. Semiconductor device 300 may include N-type and P-type IGFETs (310A/B) formed in region 140 above regions (110, 120, and 130). IGFET 310A/B may include a gate contact 316A/B, a gate structure 314A/B, vertically aligned and horizontally disposed channel regions 312A/B, gate insulating layer 320A/B, and drain/source contacts 318A/B. Gate structure 316A/B and gate insulating layer 320A/B may surround each vertically aligned and horizontally disposed channel regions 312A/B.

Drain/source contacts (318A/B) are commonly shared by the plurality of channel regions 312A/B, respectively to form common drain/source terminals for each IGFET (310A and 310B).

IGFETs (310A and 310B) may be formed by forming a layered crystal of two materials over region 130. For example, layers of silicon and silicon germanium may be formed. An etch and deposit step may then be used to form the source/drain regions (318A and 318B) may be formed. The silicon layer may form the channel regions (312A and 312B). After a vertical etch, the silicon germanium layers may be etched by using a chemical that can selectively etch silicon germanium with the source/drain regions (318A and 318B) used as support structures. Next, the gate dielectric layers (320A and 320B) may be formed using atomic layer deposition, for example of hafnium-dioxide. Then gate structure (316A and 316B) may be formed using atomic layer deposition of a metal layer, for example, tungsten. The n-type IGFETs 310A may have source/drain regions 438A doped with n-type carriers, such as phosphorous and/or arsenic, for example. The p-type IGFETs 310B may have source/drain regions 318B doped with p-type carriers, such as boron, for example. IGFETs (310A and 310B) may have a gate length L (i.e. channel length) of less than about 10 nm and may preferably have a gate length L of less than about 6 nm. IGFETs (310A and 310B) may have a gate width W (i.e. channel width) of less than about 10 nm and may preferably have a gate width W of less than about 6 nm.

Figure 4A:
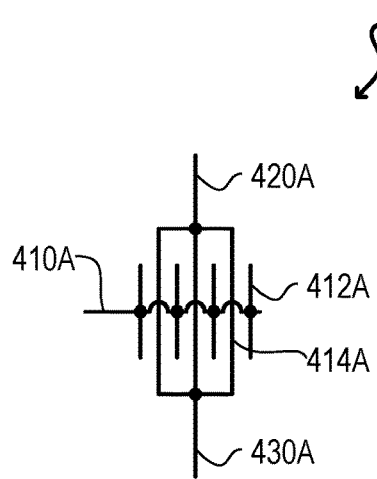
FIGS. 4A and 4B are circuit schematic diagrams of complementary insulated gate field effect transistors having a plurality of horizontally disposed channels that can be vertically aligned above a substrate with each channel being surrounded by a gate structure according to an embodiment.
Figure 4B:
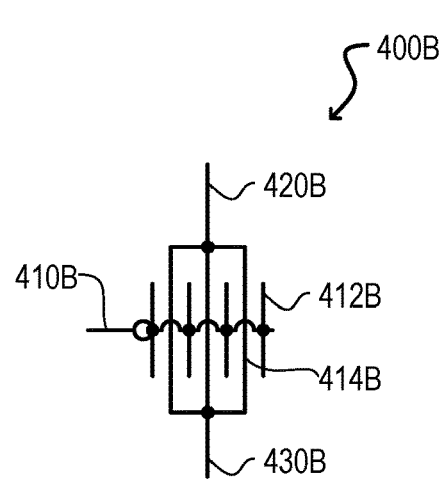

Referring now to FIGS. 4A and 4B, circuit schematic diagrams of complementary IGFETs having a plurality of horizontally disposed channels that can be vertically aligned above a substrate with each channel being surrounded by a gate structure according to an embodiment are set forth. FIG. 4A is a N-channel IGFET 400A and FIG. 4B is a P-channel IGFET 400B.

N-channel IGFET 400A includes a control gate terminal 410A, a first source/drain terminal 420A, and a second source/drain terminal 430A. Control gate terminal 410A may be electrically connected to control gate 412A. Control gate 412A may be drawn as a plurality of control gates on each side of a plurality of channel region 414A. In reality, control gate 412A may surround a plurality of horizontally disposed channel regions 414A that can be vertically aligned above a substrate. Each channel region 414A may form a controllable impedance path between first source/drain terminal 420A, and second source/drain terminal 430A. Control gate 412A may provide control to the controllable impedance path based on a threshold voltage for distinguishing between a high impedance path and a low impedance path.

P-channel IGFET 400B includes a control gate terminal 410B, a first source/drain terminal 420B, and a second source/drain terminal 430B. Control gate terminal 410B may be electrically connected to control gate 412B. Control gate 412B may be drawn as a plurality of control gates on each side of a plurality of channel region 414B. In reality, control gate 412B may surround a plurality of horizontally disposed channel regions 414B that can be vertically aligned above a substrate. Each channel region 414B may form a controllable impedance path between first source/drain terminal 420B, and second source/drain terminal 430B. Control gate 412B may provide control to the controllable impedance path based on a threshold voltage for distinguishing between a high impedance path and a low impedance path.

It is understood throughout the FIGS. (figures), any IGFET drawn similarly to IGFETs (400A and/or 400B) illustrate IGFETs that have a plurality of horizontally disposed and vertically aligned channel regions.

Figure 5:
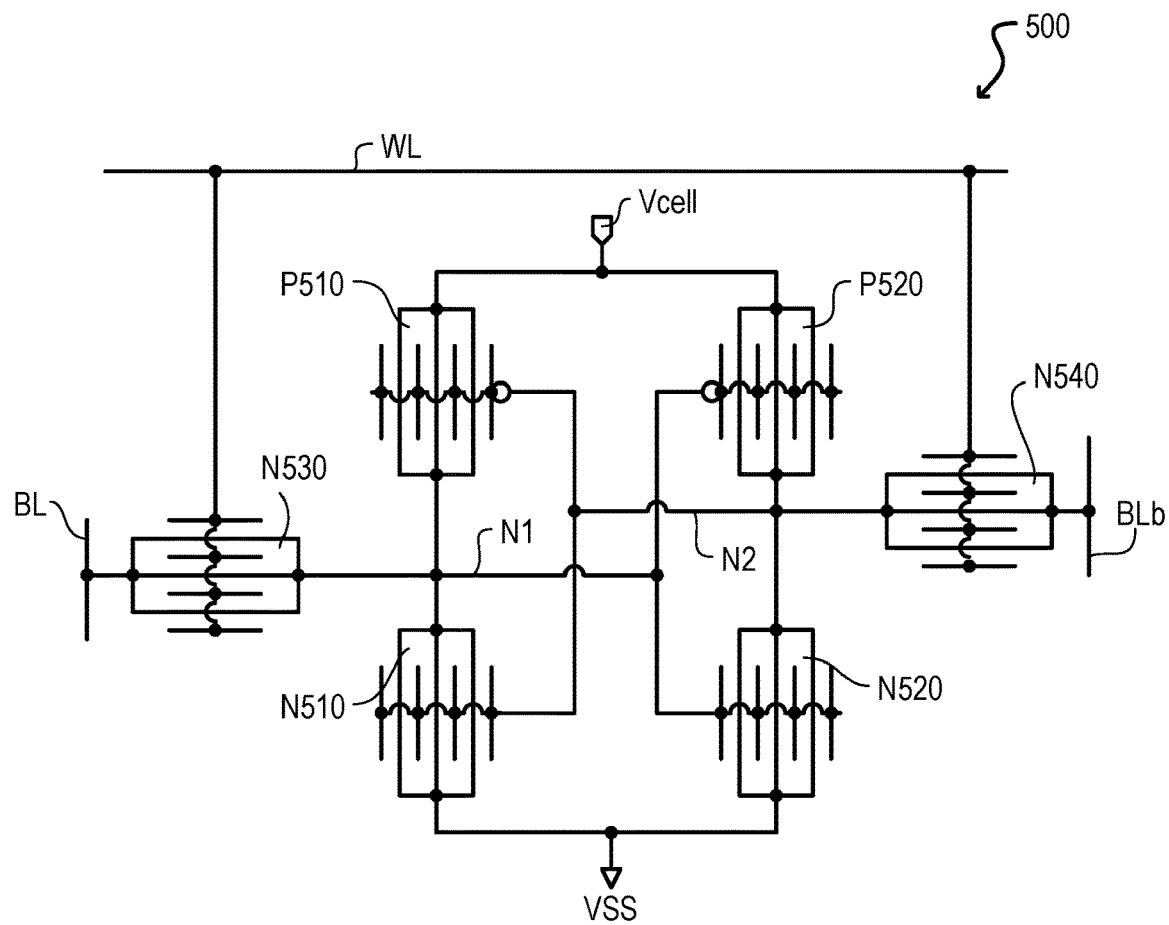
FIG. 5 is a circuit schematic diagram of an SRAM memory cell according to an embodiment.

Referring now to FIG. 5, an SRAM memory cell is set forth in a circuit schematic diagram and given the general reference character 500.

SRAM memory cell may include IGFETs (P510, P520, N510, N520, N530, and N540). IGFETs (P510, P520, N510, N520, N530, and N540) may each have a plurality of horizontally disposed and vertically aligned channel regions that are surrounded by a control gate.

IGFET P510 may have a source terminal electrically connected to receive a memory cell power supply potential Vcell, a drain terminal electrically connected to a storage node N1, and a gate terminal electrically connected to storage node N2. IGFET P520 may have a source terminal electrically connected to receive a memory cell power supply potential Vcell, a drain terminal electrically connected to a storage node N2, and a gate terminal electrically connected to storage node N1. IGFETs (P510 and P520) may be P-channel IGFETs, also known as P-type IGFETs.

IGFET N510 may have a source terminal electrically connected to a reference potential VSS, a drain terminal electrically connected to storage node N1, and a gate terminal electrically connected to storage node N2. IGFET N520 may have a source terminal electrically connected to a reference potential VSS, a drain terminal electrically connected to storage node N2, and a gate terminal electrically connected to storage node N1. IGFET N530 may have a first source/drain terminal electrically connected to bit line BL, a second source/drain terminal electrically connected to storage node N1 and a gate terminal electrically connected to a word line WL. In this way, IGFET N530 can form a controllable impedance path between bit line BL and storage node N1. IGFET N540 may have a first source/drain terminal electrically connected to complementary bit line BLb, a second source/drain terminal electrically connected to storage node N2 and a gate terminal electrically connected to a word line WL. In this way, IGFET N540 can form a controllable impedance path between complementary bit line BLb and storage node N2. IGFETs (N510, N520, N530 and N540) may be N-channel IGFETs, also known as N-type IGFETs.

Figure 6:
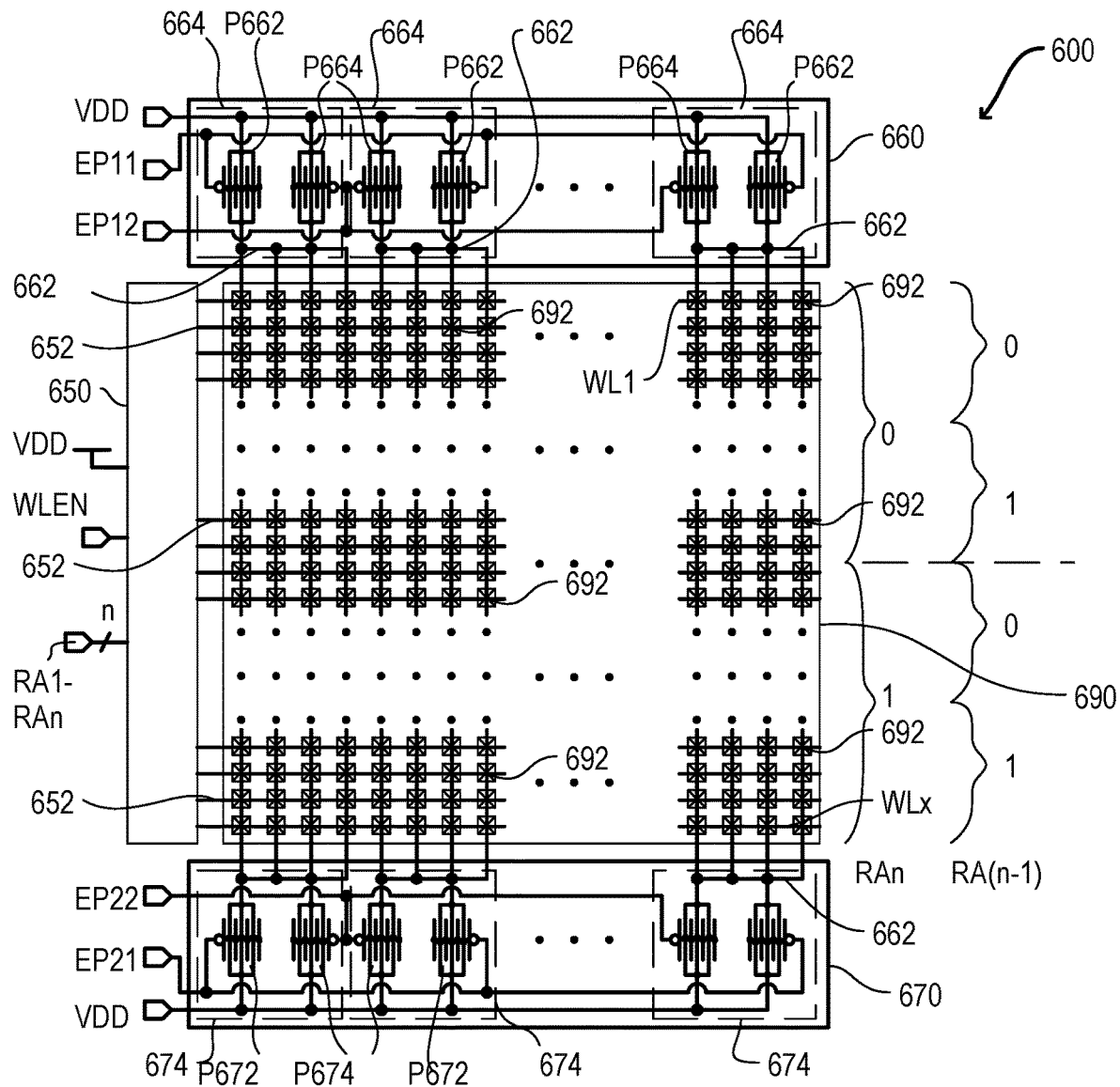
FIG. 6 is a circuit schematic diagram of an integrated circuit device portion including an SRAM portion according to an embodiment.

Referring now to FIG. 6, an integrated circuit device portion including an SRAM portion having end power supply circuits providing a write assist according to an embodiment is set forth in a circuit schematic diagram and given the general reference character 600.

Integrated circuit device portion 600 may correspond to a portion of integrated circuit device of FIG. 2. In particular, integrated circuit device 600 may have similar constituents as integrated circuit device 200, such constituents may begin with the general reference character "6" instead of "2".

Integrated circuit device portion 600 illustrates a more detailed embodiment of SRAM array 290 and end power supply select circuits (260 and 270) of integrated circuit device 200 of FIG. 2.

Integrated circuit device portion 600 can include a row decoder circuit 650, end power select circuits (660 and 670), and an SRAM array 690.

Row decoder circuit 650 may receive a word line enable signal WLEN, row address signals (RA1 to RAn), where n is the number of row addresses, and power supply potential VDD and may provide word line signals to word lines 652 (WL1 to WLx), where x is the number of word lines in SRAM array 690.

End power supply select circuit 660 may receive power supply potential VDD and end power supply control signals (EP11 and EP12) and may provide a power supply potential to SRAM array power lines 662. SRAM array power lines 662 may provide power to SRAM cells 692 in SRAM array 690.

End power supply select circuit 670 may receive power supply potential VDD and end power supply control signals (EP21 and EP22) and may provide a power supply potential to SRAM array power lines 662. SRAM array power lines 662 may provide power to SRAM cells 692 in SRAM array 690.

SRAM array 690 may be electrically connected to word lines WL1 to WLx and SRAM array power lines 662.

SRAM array 690 may include SRAM memory cells 692. Each SRAM memory cell 692 may be located at a cross point of an individual word line (WL1 to WLx) and a bit line pair (not shown in order to avoid unduly cluttering the figure). Bit line pairs may be disposed essentially orthogonal to word lines (WL1 to WLx). Each memory cell 692 may be electrically connected to an array power line 662. Array power lines 662 may be arranged substantially in parallel to bit line pairs and substantially perpendicular to word lines (WL1 to WLx).

End power select circuit 660 may include selection circuits 664. Each power enable circuit 664 are electrically connected to receive power supply potential VDD and end power supply control signals (EP11 and EP12). Each selection circuit 664 is electrically connected to a plurality of array power lines 662. Each selection circuit 664 can include IGFETs (P662 and P664). IGFET P662 can receive end power supply control signal EP11 at a control gate terminal. IGFET P662 may have a source terminal electrically connected to receive power supply potential VDD and a drain terminal electrically connected to a plurality of array power supply lines 662. IGFET P664 can receive end power supply control signal EP12 at a control gate terminal. IGFET P664 may have a source terminal electrically connected to receive power supply potential VDD and a drain terminal electrically connected to a plurality of array power supply lines 662. IGFETs (P662 and P664) may be P-channel IGFETs. End power select circuit 660 may provide a controllable impedance path between power supply potential VDD and a group of power supply lines 662 at a first end of SRAM array 690.

End power select circuit 670 may include selection circuits 674. Each power enable circuit 674 are electrically connected to receive power supply potential VDD and end power supply control signals (EP21 and EP22). Each selection circuit 674 is electrically connected to a plurality of array power lines 662. Each selection circuit 674 can include IGFETs (P672 and P674). IGFET P672 can receive end power supply control signal EP21 at a control gate terminal. IGFET P672 may have a source terminal electrically connected to receive power supply potential VDD and a drain terminal electrically connected to a plurality of array power supply lines 672. IGFET P674 can receive end power supply control signal EP22 at a control gate terminal. IGFET P674 may have a source terminal electrically connected to receive power supply potential VDD and a drain terminal electrically connected to a plurality of array power supply lines 672. IGFETs (P672 and P674) may be P-channel IGFETs. End power select circuit 670 may provide a controllable impedance path between power supply potential VDD and a group of power supply lines 662 at a second end of SRAM array 690.

It is understood that power supply lines 662 and word lines 652 may be essentially perpendicular to each other, however, word lines 652 do not contact power supply lines 662 and are formed by a different layer of interconnect material formed on a different plane.

Figure 7:
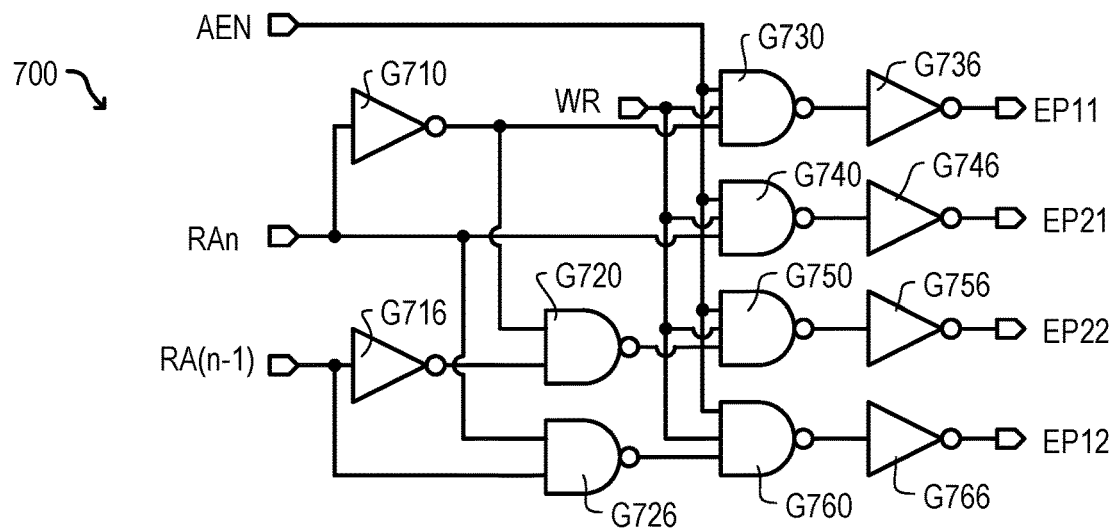
FIG. 7 is a circuit schematic diagram of an array power control circuit according to an embodiment.

Referring now to FIG. 7, an array power control circuit is set forth in a circuit schematic diagram and given the general reference character 700. Array power control circuit 700 may be used as array power control circuit 240 on integrated circuit device 200 of FIG. 2.

Array power control circuit 700 may receive assist enable signal AEN, row address (RAn and RA(n−1)) and write signal WR and may provide end power supply control signals (EP11, EP21, EP12, and EP22). Row address RAn may be the most significant row address bit received by row decoder circuit (250 and 650) of FIGS. 2 and 6, respectively. Row address RA(n−1) may be the next most significant row address bit received by row decoder circuit (250 and 650) of FIGS. 2 and 6, respectively.

Array power control circuit 700 may include logic gates (G710, G716, G720, G726, G730, G736, G740, G746, G750, G756, G760, and G766).

Logic gate G710 may receive row address signal RAn at an input terminal and may provide an output at an output terminal. Logic gate G710 may be an inverter logic gate. Logic gate G716 may receive row address signal RA(n−1) at an input terminal and may provide an output at an output terminal. Logic gate G716 may be an inverter logic gate. Logic gate G720 may receive the output of logic gate G710 and the output of logic gate G716 at respective input terminals and may provide an output. Logic gate G720 may be a NAND logic gate. Logic gate G726 may receive row address signal RAn and row address signal RA(n−1) at respective input terminals and may provide an output. Logic gate G726 may be a NAND logic gate.

Logic gate G730 may receive assist enable signal AEN, write signal WR, and the output of logic gate G710 at respective input terminals and may provide an output. Logic gate G730 may be a NAND logic gate. Logic gate G736 may receive the output of logic gate G730 at an input and may provide end power supply control signal EP11 at an output terminal. Logic gate G736 may be an inverter logic gate.

Logic gate G740 may receive assist enable signal AEN, write signal WR, and row address signal RAn at respective input terminals and may provide an output. Logic gate G740 may be a NAND logic gate. Logic gate G746 may receive the output of logic gate G740 at an input and may provide end power supply control signal EP21 at an output terminal. Logic gate G746 may be an inverter logic gate.

Logic gate G750 may receive assist enable signal AEN, write signal WR, and the output of logic gate G720 at respective input terminals and may provide an output. Logic gate G750 may be a NAND logic gate. Logic gate G756 may receive the output of logic gate G750 at an input and may provide end power supply control signal EP22 at an output terminal. Logic gate G756 may be an inverter logic gate.

Logic gate G760 may receive assist enable signal AEN, write signal WR, and the output of logic gate G726 at respective input terminals and may provide an output. Logic gate G760 may be a NAND logic gate. Logic gate G766 may receive the output of logic gate G760 at an input and may provide end power supply control signal EP12 at an output terminal. Logic gate G766 may be an inverter logic gate.

The operation of integrated circuit device will now be discussed with reference to FIGS. 1 through 9.

Figure 8:
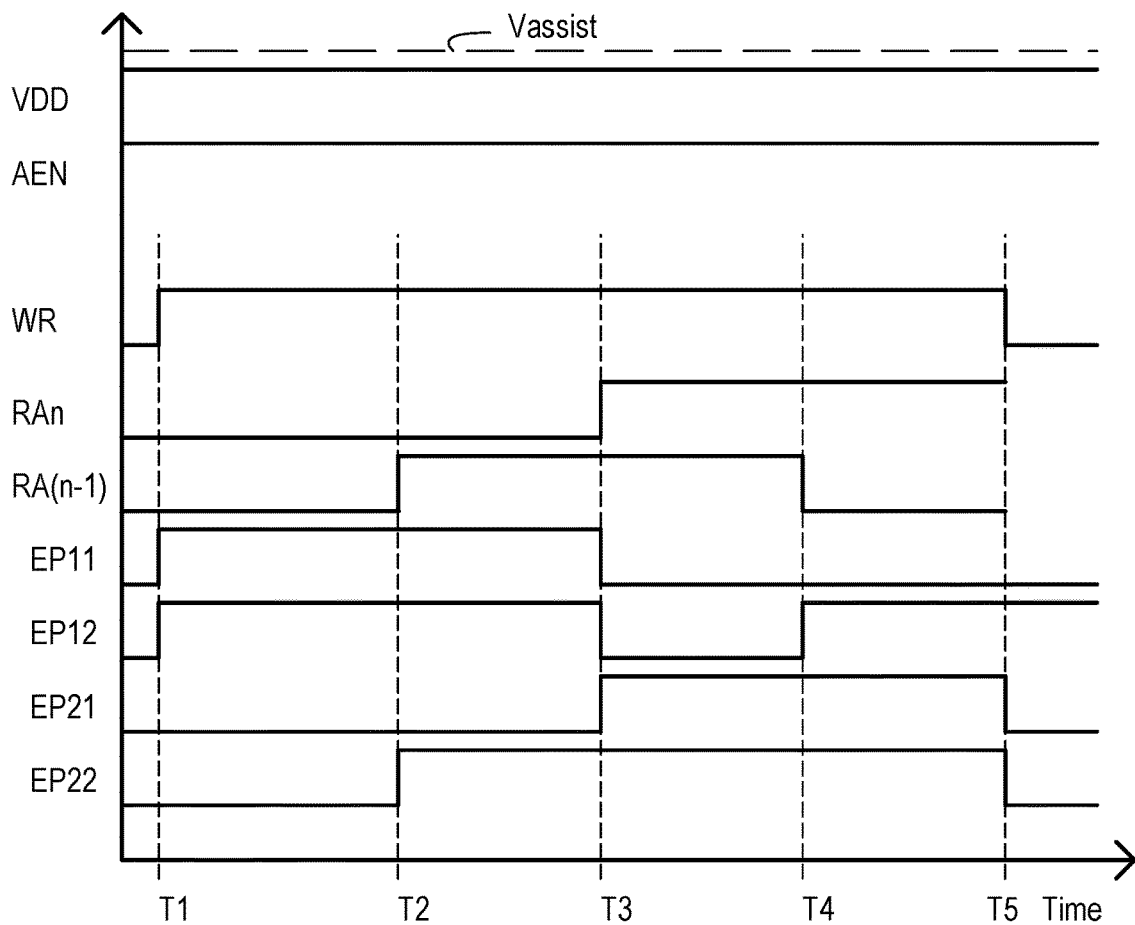
FIG. 8 is a logic timing diagram of an operation of the integrated circuit device when the power supply potential is below an assist potential according to an embodiment.

FIG. 8 is a timing logic diagram of the integrated circuit device when the power supply potential is below an assist potential Vassist.

Referring to FIG. 8, power supply potential VDD has a potential value that is less than an assist potential Vassist. When power supply potential VDD is less than assist potential Vassist, power supply level detection circuit 235 (FIG. 2) may provide an assist enable signal AEN having a logic high level (assist enable logic level). In this way, write assist may be enabled to increase the write margin to SRAM array 290 at lower operating levels (i.e. power supply potentials).

At time T1, write signal WR (i.e write enable signal) may go high, indicating a write operation to SRAM array 290. With write signal WR at a logic high and assist enable signal AEN at a logic high, logic gates (G730, G740, G750, and G760) in array power control circuit 700 of FIG. 7 may be enabled. In this way, power control circuit 700 may select IGFETs (P662, P664, P672 and/or P674) in a selection circuit (664 or 674) in respective end power select circuit (660 or 670) (FIG. 6) in accordance with a location of a selected word line (WL1 to WLx) in array 690.

Also at time T1, with write signal WR at a logic high level, indicating an initiation of a write operation in which data may be written to a selected cell or selected cells in SRAM array (690, 290). With row address signal RAn at a logic low level, and row address signal RA(n−1) at a logic low level, the SRAM cell that is being written to may be in the top quadrant as illustrated in SRAM array 690 of FIG. 6. In this case, power control circuit 700 may provide end power control signals (EP21 and EP22) having a logic low level and end power control signals (EP11 and EP12) having a logic high level. In this way, selection circuits in end power select circuit 670 may be enabled by placing IGFETs (P672 and P674) in low impedance states and end power select circuit 660 may be disable by placing IGFETs (P662 and P664) in high impedance states. By doing so, a resistance between power supply potential VDD and a selected memory cell 692 may be increased by providing the power supply potential through a longer portion of the power supply line 662. By doing so, the supply potential at the selected memory cell may be at a lower potential due to an I-R (current times resistance) drop and data may be written to a selected memory cell 692 more reliably, as the pull up capabilities of the p-type IGFETs (P510 and P520) may not be able to overcome the pull down capabilities of N-channel IGFETs (N530, N510) (for example when writing a zero in the memory cell (500, 692)) or N-channel IGFETs (N540, N520) (for example when writing a one in the memory cell (500, 692)). It should be noted that the word line potential at the select gate IGFETs (N530 and N540) may still be substantially at a full power supply potential VDD as the row decoder circuit 250 may be powered locally and in proximity to the row decoder circuit 250 and the select gate IGFETs (N530 and N540) may essentially have a boosted control gate potential as compared to the power potential driving the selected memory cell 692.

At time T2, row address RAn may be low and row address RA(n−1) may transition to a logic high level. With row address signal RAn at a logic low level, and row address signal RA(n−1) at a logic high level, a word line (WL1 to WLx) in the top middle quadrant may become active and the SRAM cell that is being written to may be in the top middle quadrant as illustrated in SRAM array 690 of FIG. 6. In this case, power control circuit 700 may provide end power control signal EP21 having a logic low level and end power control signals (EP22, EP11, and EP12) having a logic high level. In this way, selection circuits in end power select circuit 670 may be enabled by placing IGFET P672 in low impedance states and may place IGFET P674 in a high impedance state. End power select circuit 660 may be disabled by placing IGFETs (P662 and P664) in high impedance states. By doing so, a resistance between power supply potential VDD and a selected memory cell 692 may be increased by providing the power supply potential through a longer portion of the power supply line 662. It is noted that the distance between the between power supply potential VDD and a selected memory cell 692 may be substantially less than the case at time T1 as the selected memory cell in the upper middle quadrant is closer to the enabled end power select circuit 670. This can substantially reduce the resistance (impedance) of the power supply line 662. However, by turning off IGFET P674, the impedance (resistance) of the end power select circuit 670 may be substantially increased to provide an I-R drop more consistent to the I-R drop provided at time T1 to the selected memory cell 692. By doing so, the supply potential at the selected memory cell may be at a lower potential due to an I-R (current times resistance) drop and data may be written to a selected memory cell 692 more reliably, as the pull up capabilities of the p-type IGFETs (P510 and P520) may not be able to overcome the pull down capabilities of N-channel IGFETs (N530, N510) (for example when writing a zero in the memory cell (500, 692)) or N-channel IGFETs (N540, N520) (for example when writing a one in the memory cell (500, 692)). It should be noted that the word line potential at the select gate IGFETs (N530 and N540) may still be substantially at a full power supply potential VDD as the row decoder circuit 250 may be powered locally and in proximity to the row decoder circuit 250 and the select gate IGFETs (N530 and N540) may essentially have a boosted control gate potential as compared to the power potential driving the selected memory cell 692.

At time T3, row address RA(n−1) may be high and row address RA(n) may transition to a logic high level. With row address signal RAn at a logic high level, and row address signal RA(n−1) at a logic high level, the SRAM cell that is being written to may be in the bottom quadrant as illustrated in SRAM array 690 of FIG. 6. In this case, power control circuit 700 may provide end power control signals (EP21 and EP22) having a logic high level and end power control signals (EP11 and EP12) having a logic low level. In this way, selection circuits in end power select circuit 660 may be enabled by placing IGFETs (P662 and P664) in low impedance states and end power select circuit 670 may be disable by placing IGFETs (P672 and P674) in high impedance states. By doing so, a resistance between power supply potential VDD and a selected memory cell 692 may be increased by providing the power supply potential through a longer portion of the power supply line 662. By doing so, the supply potential at the selected memory cell may be at a lower potential due to an I-R (current times resistance) drop and data may be written to a selected memory cell 692 more reliably, as the pull up capabilities of the p-type IGFETs (P510 and P520) may not be able to overcome the pull down capabilities of N-channel IGFETs (N530, N510) (for example when writing a zero in the memory cell (500, 692)) or N-channel IGFETs (N540, N520) (for example when writing a one in the memory cell (500, 692)). It should be noted that the word line potential at the select gate IGFETs (N530 and N540) may still be substantially at a full power supply potential VDD as the row decoder circuit 250 may be powered locally and in proximity to the row decoder circuit 250 and the select gate IGFETs (N530 and N540) may essentially have a boosted control gate potential as compared to the power potential driving the selected memory cell 692.

At time T4, row address RAn may be at a logic high and row address RA(n−1) may transition to a logic low level. With row address signal RAn at a logic high level, and row address signal RA(n−1) at a logic low level, a word line (WL1 to WLx) in the bottom middle quadrant may become active and the SRAM cell that is being written to may be in the bottom middle quadrant as illustrated in SRAM array 690 of FIG. 6. In this case, power control circuit 700 may provide end power control signal EP11 having a logic low level and end power control signals (EP22, EP21, and EP12) having a logic high level. In this way, selection circuits in end power select circuit 660 may be enabled by placing IGFET P662 in low impedance states and may place IGFET P664 in a high impedance state. End power select circuit 670 may be disabled by placing IGFETs (P672 and P674) in high impedance states. By doing so, a resistance between power supply potential VDD and a selected memory cell 692 may be increased by providing the power supply potential through a longer portion of the power supply line 662. It is noted that the distance between the between power supply potential VDD and a selected memory cell 692 may be substantially less than the case at time T3 as the selected memory cell in the lower middle quadrant is closer to the enabled end power select circuit 660. This can substantially reduce the resistance (impedance) of the power supply line 662. However, by turning off IGFET P664, the impedance (resistance) of the end power select circuit 660 may be substantially increased to provide an I-R drop more consistent to the I-R drop provided at time T3 to the selected memory cell 692. By doing so, the supply potential at the selected memory cell may be at a lower potential due to an I-R (current times resistance) drop and data may be written to a selected memory cell 692 more reliably, as the pull up capabilities of the p-type IGFETs (P510 and P520) may not be able to overcome the pull down capabilities of N-channel IGFETs (N530, N510) (for example when writing a zero in the memory cell (500, 692)) or N-channel IGFETs (N540, N520) (for example when writing a one in the memory cell (500, 692)). It should be noted that the word line potential at the select gate IGFETs (N530 and N540) may still be substantially at a full power supply potential VDD as the row decoder circuit 250 may be powered locally and in proximity to the row decoder circuit 250 and the select gate IGFETs (N530 and N540) may essentially have a boosted control gate potential as compared to the power potential driving the selected memory cell 692.

By providing consistent power supply VDD I-R drops regardless as to which quadrant (region), the selected memory cell is located a consistent memory cell power supply potential Vcell may be provided to a selected memory cell 692 regardless as to location in SRAM memory array 290, write margins may be more optimal and consistent to provide improved overall operating margins. In order to provide a consistent resistance (impedance) between a selected memory cell 692 and power supply VDD, the on impedance of IGFETs (P662 and P672) may be substantially less than the on impedance of IGFETs (P664 and P674). This may be done by providing IGFETs (662 and 672) with a shorter control gate length L and/or a wider control gate width W as compared to the control gate length and/or control gate width of IGFETs (664 and 674). By doing so, the resistance/impedance between a selected memory cell 692 and power supply VDD may be incrementally modified without having detrimental differences in memory cell power supply potential Vcell due to location of the selected memory cell 692 in the SRAM memory array (290 and 690).

It is noted that in the above example, the memory array 690 may be divided into quadrants or regions as determined by the two most significant row address signals (RAn and RA(n−1). A substantially consistent memory cell power supply potential Vcell may be provided during a write operation to a selected memory cell 692 regardless as to the quadrant or region in which the selected memory cell 692 may be located. In the above example a first region/quadrant may be the area illustrated of memory array 690 when row address RAn=0 and row address RA(n−1)=0, a second region/quadrant may be the area illustrated of memory array 690 when row address RAn=0 and row address RA(n−1)=1, a third region/quadrant may be the area illustrated of memory array 690 when row address RAn=1 and row address RA(n−1)=0, and a fourth region/quadrant may be the area illustrated of memory array 690 when row address RAn=1 and row address RA(n−1)=1.

Figure 9:
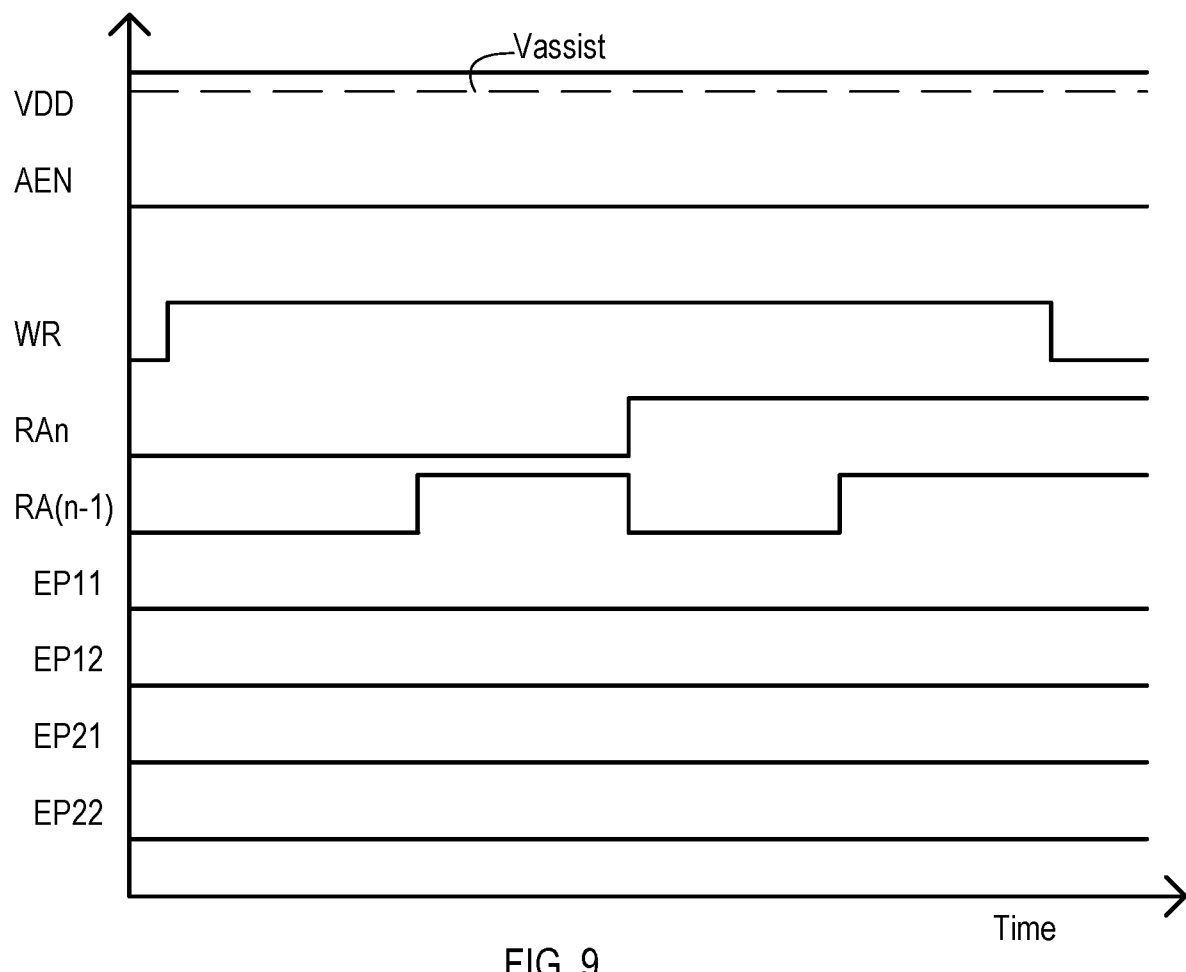
FIG. 9 is a logic timing diagram of an operation of the integrated circuit device when the power supply potential is above an assist potential according to an embodiment.

FIG. 9 is a logic timing diagram of the integrated circuit device when the power supply potential VDD is greater than assist potential Vassist.

Referring now to FIG. 9, power supply potential VDD is above assist potential Vassist. When power supply potential VDD is greater than assist potential Vassist, power supply level detection circuit 235 (FIG. 2) may provide an assist enable signal AEN having a logic low level (assist disable logic level). In this way, write assist may be disabled as the write assist may not be needed to provide increased write margin due to the increased current driving capabilities of of N-channel IGFETs (N530, N510) in SRAM memory cell 500.

With assist enable signal AEN at a logic low level, logic gates (G730, G740, G750, and G760) in array power control circuit 700 of FIG. 7 may be disabled and end power control signals (EP11, EP21, EP12, and EP22) may all be forced to a logic low level. With end power control signals (EP11, EP21, EP12, and EP22) at a logic low level, IGFETs (P662, P664, P672, and P674) in selection circuits (664 and 674) in respective end power select circuits (660 and 670) may be in a low impedance state and IR drops to memory power supply potential Vcell at a selected memory cell 692 may be reduced.

It should be noted, during a read operation in which data is provided from a selected memory cell 692, write enable signal WR is at a logic low level. In this way, power control circuit 700 provides end power control signals (EP11, EP21, EP12, and EP22) may all be forced to a logic low level. With end power control signals (EP11, EP21, EP12, and EP22) at a logic low level, IGFETs (P662, P664, P672, and P674) in selection circuits (664 and 674) in respective end power select circuits (660 and 670) may be in a low impedance state and IR drops to memory power supply potential Vcell at a selected memory cell 692 may be reduced and the speed of a read operation may not be inhibited.

Figure 10:
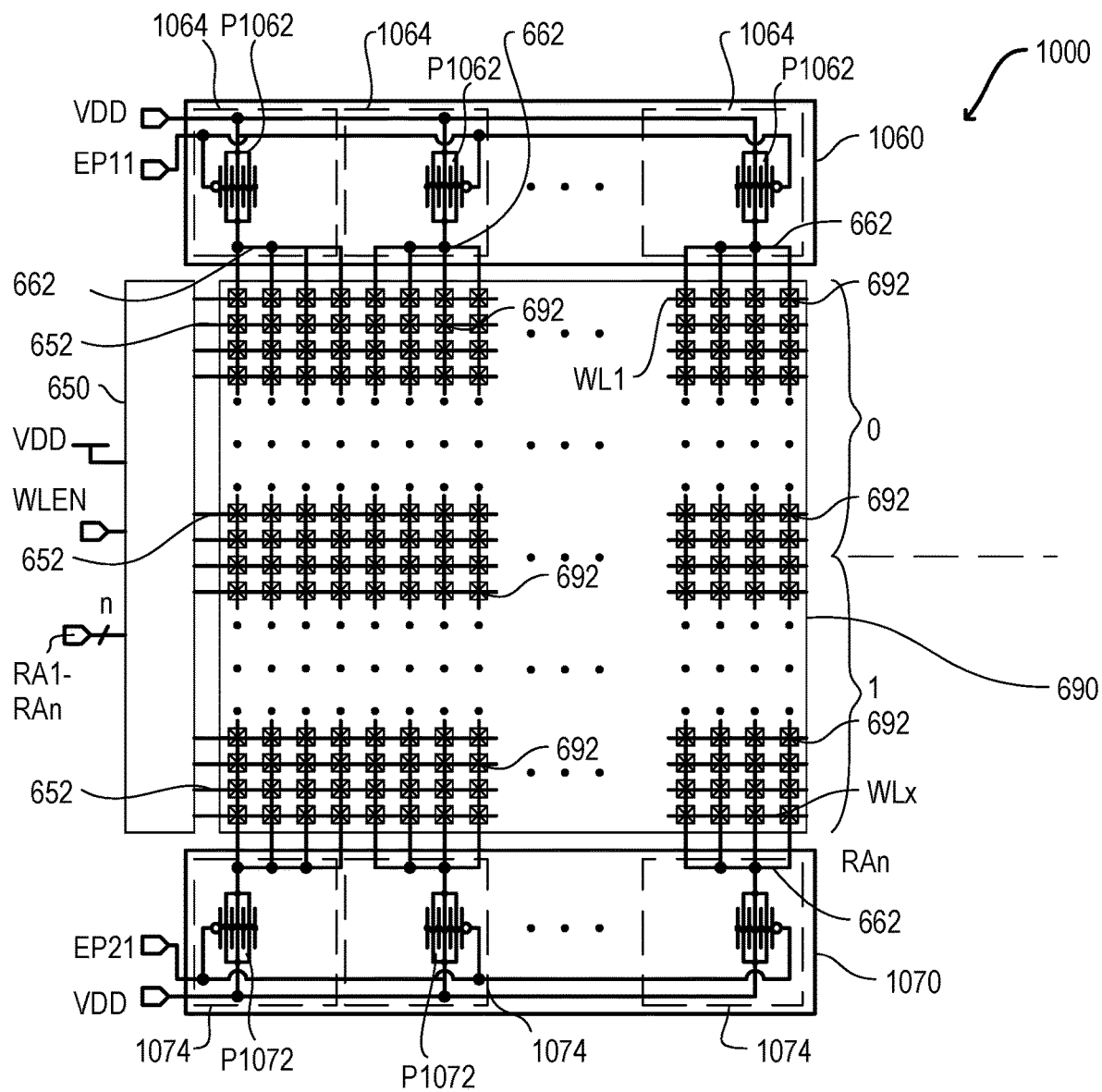
FIG. 10 is an integrated circuit device portion including an SRAM portion having end power supply circuits providing a write assist according to an embodiment.

Referring now to FIG. 10, an integrated circuit device portion including an SRAM portion having end power supply circuits providing a write assist according to an embodiment is set forth in a circuit schematic diagram and given the general reference character 1000.

Integrated circuit device portion 1000 may include constituents that are the same as constituents of integrated circuit portion 600, such constituents are given the same reference character. In particular, integrated circuit device 1000 may have differ from integrated circuit device portion 600 in that integrated circuit device portion 1000 may have end power select circuits (1060 and 1070) that include select circuits (1064 and 1074) having a single IGFET (P1062 and P1072) respectively. IGFET P1062 may receive end power control signal EP11 at a gate terminal and IGFET P1072 may receive end power control signal EP21 at a gate terminal.

Figure 11:
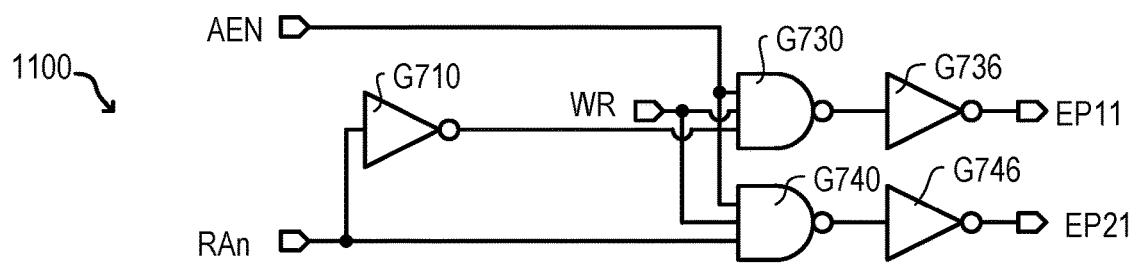
FIG. 11 is a circuit schematic diagram an array power control circuit according to an embodiment.

Referring now to FIG. 11, an array power control circuit is set forth in a circuit schematic diagram and given the general reference character 1100. Array power control circuit 1100 may be used as array power control circuit 240 on integrated circuit device 200 of FIG. 2 in conjunction with integrated circuit device portion 1000. Array power control circuit 1100 may include the same constituents as array power control circuit 700 for generating end power control signals (EP11 and EP21) as set forth above.

Figure 12:
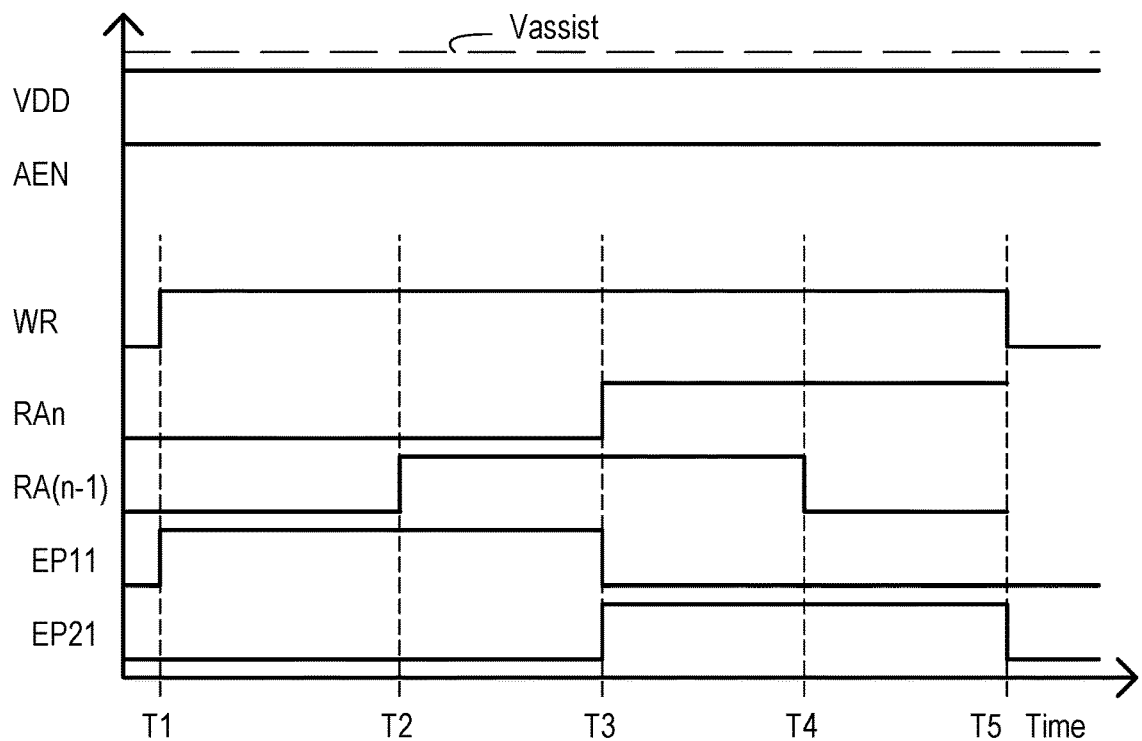
FIG. 12 is a logic timing diagram of an operation of the integrated circuit device when the power supply potential is below an assist potential according to an embodiment.

FIG. 12 is a logic timing diagram of the integrated circuit device implementing integrated circuit device portion 1000 when the power supply potential is below an assist potential Vassist.

Referring to FIG. 12, power supply potential VDD has a potential value that is less than an assist potential Vassist. When power supply potential VDD is less than assist potential Vassist, power supply level detection circuit 235 (FIG. 2) may provide an assist enable signal AEN having a logic high level (assist enable logic level). In this way, write assist may be enabled to increase the write margin to SRAM array 290 at lower operating levels.

As shown in FIG. 12, end power select circuit 1060 may be enabled (IGFET 1062 is in a low impedance state) and end power select circuit 1070 may be disabled (IGFET 1072 is in a high impedance state) when the selected memory cell 692 is in the lower half of the SRAM array 690. End power select circuit 1070 may be enabled (IGFET 1072 is in a low impedance state) and end power select circuit 1060 may be disabled (IGFET 1062 is in a high impedance state) when the selected memory cell 692 is in the upper half of the SRAM array 690. By doing so, a resistance between power supply potential VDD and a selected memory cell 692 may be increased by providing the power supply potential through a longer portion of the power supply line 662. In this way, the supply potential at the selected memory cell may be at a lower potential due to an I-R (current times resistance) drop and data may be written to a selected memory cell 692 more reliably, as the pull up capabilities of the p-type IGFETs (P510 and P520) may not be able to overcome the pull down capabilities of N-channel IGFETs (N530, N510) (for example when writing a zero in the memory cell (500, 692)) or N-channel IGFETs (N540, N520) (for example when writing a one in the memory cell (500, 692)). It should be noted that the word line potential at the select gate IGFETs (N530 and N540) may still be substantially at a full power supply potential VDD as the row decoder circuit 250 may be powered locally and in proximity to the row decoder circuit 250 and the select gate IGFETs (N530 and N540) may essentially have a boosted control gate potential as compared to the power potential driving the selected memory cell 692.

Figure 13:
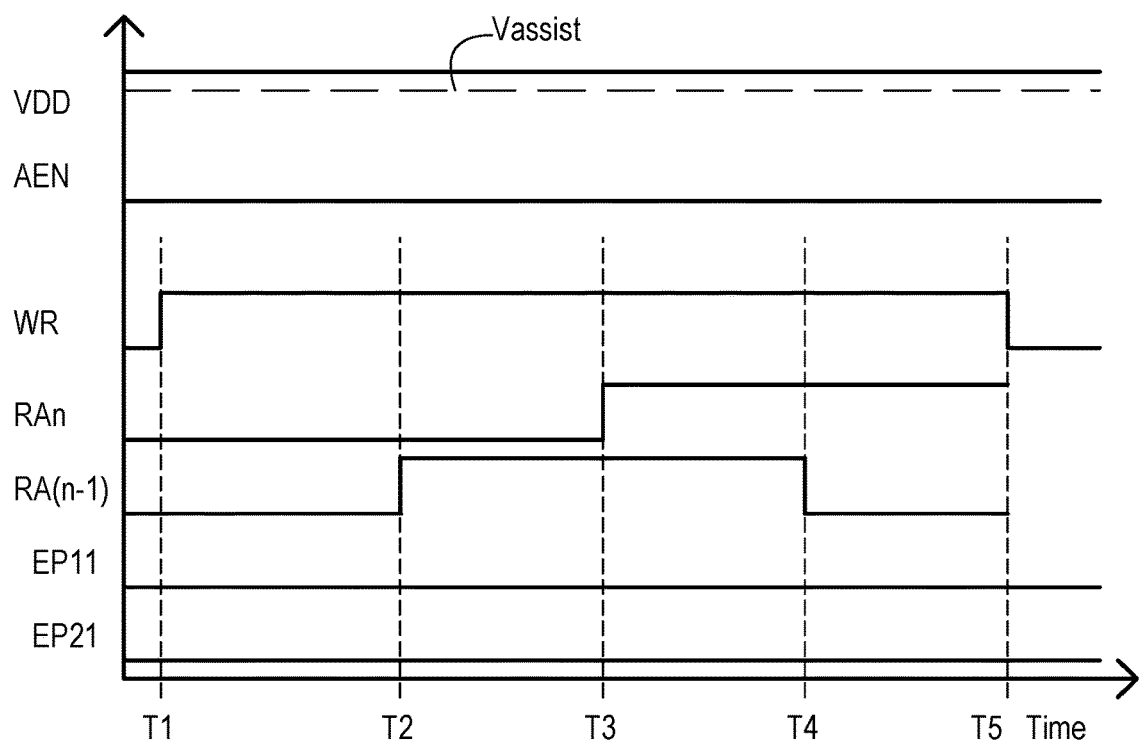
FIG. 13 is a logic timing diagram of an operation of the integrated circuit device when the power supply potential is above an assist potential according to an embodiment.

FIG. 13 is a timing logic diagram of the integrated circuit device when the power supply potential VDD is greater than assist potential Vassist.

Referring now to FIG. 13, power supply potential VDD is above assist potential Vassist. When power supply potential VDD is greater than assist potential Vassist, power supply level detection circuit 235 (FIG. 2) may provide an assist enable signal AEN having a logic low level (assist disable logic level). In this way, write assist may be disabled as the write assist may not be needed to provide increased write margin due to the increased current driving capabilities of of N-channel IGFETs (N530, N510) in SRAM memory cell 500.

With assist enable signal AEN at a logic low level, logic gates (G730 and G740) in array power control circuit 1100 of FIG. 11 may be disabled and end power control signals (EP11 and EP21) may be forced to a logic low level. With end power control signals (EP11 and EP21) at a logic low level, IGFETs (P1062 and P1072) in selection circuits (1064 and 1074) in respective end power select circuits (1060 and 1070) may be in a low impedance state and IR drops to memory power supply potential Vcell at a selected memory cell 692 may be reduced.

Figure 14:
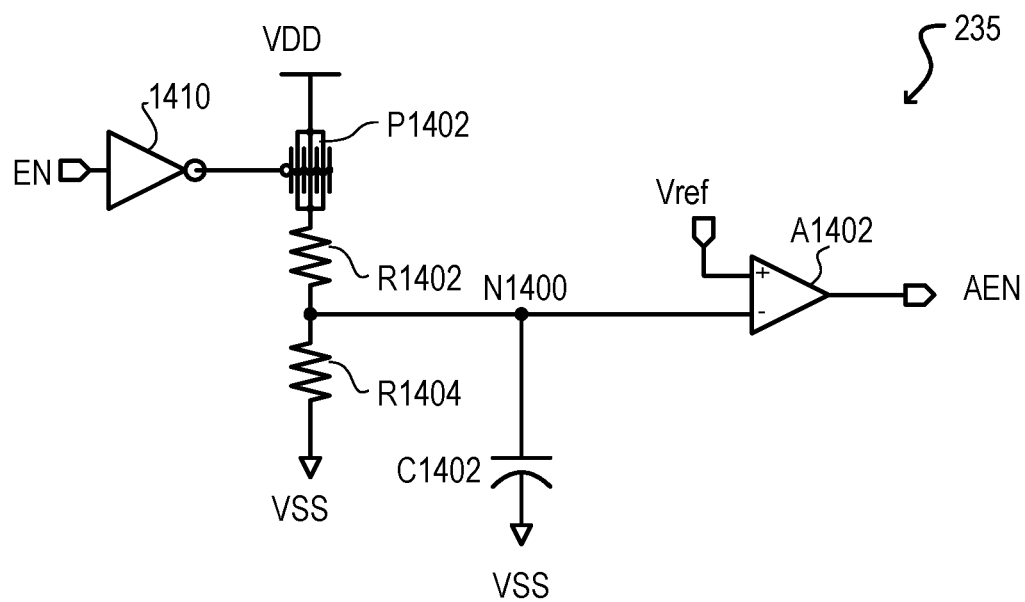
FIG. 14 is a circuit schematic diagram of a power supply level detection circuit according to an embodiment.

Referring now to FIG. 14, a circuit schematic diagram of power supply level detection circuit 235 according to an embodiment is set forth.

Power supply detection circuit 235 includes a logic gate 1410, IGFET P1402, resistors (R1402 and R1404), a capacitor C1402, and an amplifier circuit A1402.

Logic gate 1410 receives comparison enable signal EN at an input terminal and provides an output. Logic gate 1410 may be an inverter logic gate. IGFET P1402 may receive power supply potential VDD at a source terminal, and may receive the output of logic gate 1410 at a control gate terminal, and may have a drain terminal connected to a first terminal of resistor R1402. IGFET P1402 may be a p-type IGFET. Resistor R1402 may have a second terminal connected to a node N1400. Resistor R1404 may have a first terminal connected to reference potential VSS (ground reference potential) and a second terminal connected to node N1400. Capacitor C1402 may have a first terminal connected to reference potential VSS and a second terminal connected to node N1400. Amplifier circuit A1402 may be a differential amplifier circuit and may have a negative input terminal connected to node N1400 and a positive input terminal connected to receive a reference potential Vref, and may provide assist enable signal AEN at an output terminal.

The operation of power supply detection circuit 235 will now be explained. When comparison enable signal EN is at a logic low level (comparison disable logic level), logic gate 1410 may provide a logic high output. With a logic high level at the control gate of IGFET P1402, IGFET P1402 may provide a high impedance path between power supply potential VDD and the first terminal of resistor R1402. In this way, resistor R1402 may pull node N1400 to reference potential VSS. Because reference potential VSS has a lower potential than reference potential Vref, amplifier circuit A1402 provides an assist enable signal having a logic high level. It is noted that when enable signal EN is at a logic low, current is prevented from flowing from power supply potential VDD to reference potential VSS through resistors (R1402 and R1404), thus power usage may be reduced.

When comparison enable signal EN is at a logic high level (comparison enable logic level), logic gate 1402 may provide a logic low output. With a logic low level at the control gate of IGFET P1402, IGFET P1402 may provide a low impedance path between power supply potential and the first terminal of resistor R1402. In this way, resistors (R1402 and R1404) may provide a voltage divider circuit to provide a potential at node N1400 that is proportional to power supply potential VDD. Reference potential Vref has been selected to provide a potential that is higher than the potential at node N1400 when write assist is needed and lower than the potential at node N1400 when write assist is not needed. Thus, when write assist is needed, amplifier circuit A1402 provides assist enable signal AEN having a logic high level (assist enable logic level) and when write assist is not needed, amplifier circuit A1402 provides assist enable signal AEN having a logic low level (assist disable logic level).

Figure 15:
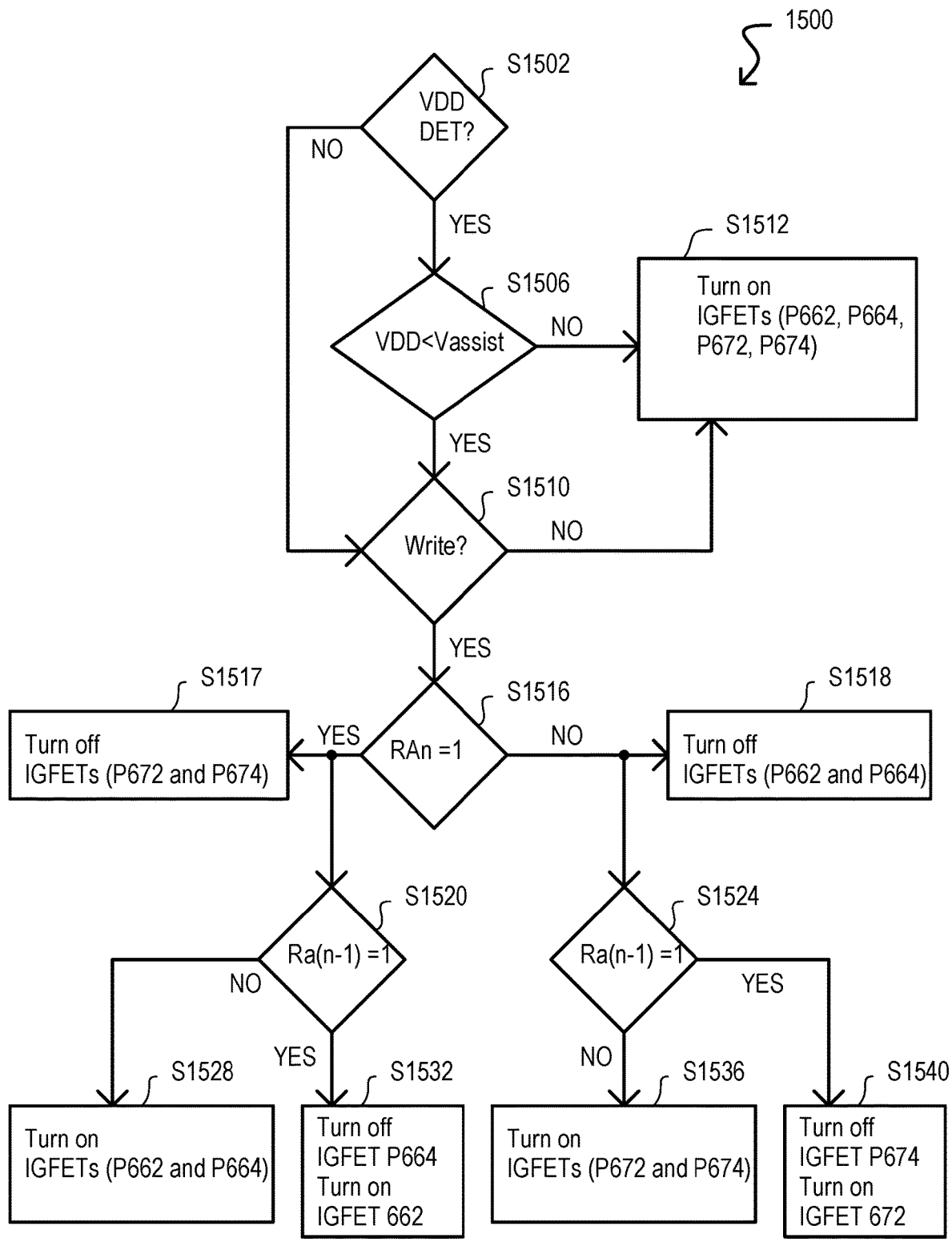
FIG. 15 is a flow chart diagram illustrating a method of operating an integrated circuit device according to an embodiment.

Referring now to FIG. 15, a flow chart diagram illustrating a method of operating an integrated circuit device according to an embodiment is set forth and given the general reference character 1500.

Method 1500 includes steps (S1502, S1506, S1510, S1512, S1516, S1517, S1518, S1520, S1524, S1528, S1532, S1536, and S1540).

Step 1502, a determination is made as to whether power supply detection circuit 235 is enabled.

At step 1506, a determination is made as to whether power supply potential VDD is less than an assist potential Vassist.

At step 1510, a determination is made as whether integrated circuit device 100 is executing a write operation.

At step 1512, all IGFETs (P662, P664, P672, and P674) in selection circuits (664 and 674) in respective end power select circuits (660 and 670) are placed in a low impedance state to provide minimal resistance between power supply potential VDD and memory cells 692.

At step S1516, a value of the most significant row address signal RAn is determined. By doing so, one of end power select circuits (660 and 670) may be enabled while the other of end power select circuit (660 and 670) may have respective IGFETs ((P662 and P664) or (P672, and P674)) placed in a high impedance state. For example, if row address signal RAn is "0", end power select circuit 660 has IGFETs (P662 and P664) placed in a high impedance state and if row address signal RAn is "1", end power select circuit 670 has IGFETs (P672 and P674) placed in a high impedance state.

At step S1517, IGFETs (P662 and P664) in selection circuit 664 of end power select circuit 660 are turned off and therefore placed in a high impedance state.

At step S1518, IGFETs (P672 and P674) in selection circuit 674 of end power select circuit 670 are turned off and therefore placed in a high impedance state.

At step S1520 and at step S1524, a value of next most significant row address RA(n−1) is determined.

At step S1528, IGFET P674 is turned off and placed in a high impedance state, and IGFET P672 is placed in a low impedance state (turned on). At this step, it has been determined that the selected memory cell is closer to the middle than the end of the array.

At step S1532, IFGETs (P672 and P674) are turned on a placed in a low impedance state. At this step, it has been determined that the selected memory cell is closer to the end of the array than the middle of the array.

At step S1536, IGFET P664 is turned off and placed in a high impedance state (turned off), and IGFET P662 is placed in a low impedance state (turned on). At this step, it has been determined that the selected memory cell is closer to the middle than the end of the array.

At step S1540, IFGETs (P662 and P664) are turned on a placed in a low impedance state (turned on). At this step, it has been determined that the selected memory cell is closer to the end of the array than the middle of the array.

During a read operation, write enable signal WR is at a logic low level.

Although row address RAn has been referred to as a most significant row address, it may refer to any row address that is used as a most significant row address of an array of memory cell and may not be a most significant row address on a data sheet or in a memory that has many memory banks or sections in which banks or sections may be selected by a more significant address.

Other electrical apparatus other than semiconductor devices may benefit from the invention.

While various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. An integrated circuit device, comprising:
an array of memory cells arranged in a plurality of rows and columns;
an array power control circuit providing at least one first end power select control signal and at least one second end power control signal;
a first end power select circuit disposed at a first end of the array of memory cells and coupled to receive the at least one first end power select control signal, the first end power select circuit includes at least one controllable impedance path coupled between a power supply potential and at least one array power line;
a second end power select circuit disposed at a second end opposite the first end of the array of memory cells and coupled to receive the at least one second end power select control signal, the second end power select circuit includes at least one controllable impedance path coupled between a power supply potential and the at least one array power line; and
a row decoder circuit coupled to activate one of a plurality of word lines to become an active one of a plurality of word lines in a first mode of operation
wherein during at least a portion of the first mode of operation, the controllable impedance path of the first end power select circuit is set in a low impedance state in response to the at least one first end power select control signal when the active one of the plurality of word lines is physically closer to the second end of the array of memory cells and is set in a high impedance state in response to the at least one first end power select control signal when the active one of the plurality of word lines is physically closer to the first end of the array of memory cells.

2. The integrated circuit device of claim 1, wherein:
during at least the portion of the first mode of operation, the controllable impedance path of the second end power select circuit is set in a low impedance state in response to the at least one second end power select control signal when the active one of the plurality of word lines is physically closer to the first end of the array of memory cells and is set in a high impedance state in response to the at least one second end power select control signal when the active one of the plurality of word lines is physically closer to the second end of the array of memory cells.

3. The integrated circuit device of claim 2, wherein:
the array of memory cells include static random access memory (SRAM) cells.

4. The integrated circuit device of claim 3, wherein:
each SRAM cell includes at least one circuit including at least one insulated gate field effect transistor (IGFET) including at least three substantially horizontally disposed channels that are substantially vertically aligned and surrounded by a contiguous control gate structure.

5. The integrated circuit device of claim 1, wherein:
the first mode of operation is a write mode of operation.

6. The integrated circuit device of claim 5, further including:
the row decoder circuit is coupled to receive the power supply potential and provide essentially the power supply potential to the active one of the plurality of word lines in the write mode of operation.

7. The integrated circuit device of claim 1, wherein:
the first end power select circuit includes a first and a second controllable impedance path coupled between a power supply potential and at least one array power line.

8. The integrated circuit device of claim 7, wherein:
during at least the portion of the first mode of operation, the first controllable impedance path of the first end power select circuit is set in a low impedance state in response to the at least one first end power select control signal when the active one of the plurality of word lines is physically closer to the second end of the array of memory cells and is set in a high impedance state in response to the at least one first end power select control signal when the active one of the plurality of word lines is physically closer to the first end of the array of memory cells; and
during at least the portion of the first mode of operation, the second controllable impedance path of the first end power select circuit is set in a low impedance state in response to the at least one first end power select control signal when the active one of the plurality of word lines is essentially physically closer to the second end of the array of memory cells than a center line of the array of memory cells and is set in a high impedance state in response to the at least one first end power select control signal when the active one of the plurality of word lines is physically closer to the center line of the array of memory cells than the second end of the array of memory cells.

9. The integrated circuit device of claim 8, wherein:
the second end power select circuit includes a first and a second controllable impedance path coupled between a power supply potential and at least one array power line.

10. The integrated circuit device of claim 9, wherein:
during at least the portion of the first mode of operation, the first controllable impedance path of the second end power select circuit is set in a low impedance state in response to the at least one second end power select control signal when the active one of the plurality of word lines is physically closer to the first end of the array of memory cells and is set in a high impedance state in response to the at least one second end power select control signal when the active one of the plurality of word lines is physically closer to the second end of the array of memory cells; and
during at least the portion of the first mode of operation, the second controllable impedance path of the second end power select circuit is set in a low impedance state in response to the at least one second end power select control signal when the active one of the plurality of word lines is essentially physically closer to the first end of the array of memory cells than a center line of the array of memory cells and is set in a high impedance state in response to the at least one second end power select control signal when the active one of the plurality of word lines physically closer to the center line of the array of memory cells than the first end of the array of memory cells.

11. The integrated circuit device of claim 1, further including:
a second mode of operation wherein during at least a portion of the second mode of operation, the controllable impedance path of the first end power select circuit and the controllable impedance path of the second end power control circuit are set in a low impedance state.

12. The integrated circuit device of claim 11, wherein:
the second mode of operation is a read mode where data in at least one memory cell is being provided external to the array of memory cells.

13. The integrated circuit device of claim 1, wherein:
the array of memory cells include a plurality of word lines disposed in a row direction and a plurality of bit lines disposed in a column direction, the at least one array power line is disposed in a column direction and provides power to at least one column of memory cells.

14. The integrated circuit device of claim 13, wherein:
the at least one array power line includes at least two array power lines.

15. The integrated circuit device of claim 14, wherein:
the at least one array power line includes at least four array power lines.

16. The integrated circuit device of claim 1, wherein:
the array power control circuit is coupled to receive an assist enable signal and a write signal, the write signal indicates a write operation in which data is written to a selected one of the memory cells, the first mode of operation is set when the write signal has a write enable logic level.

17. The integrated circuit device of claim 16, further including the steps of:
the array power control circuit is coupled to receive at least one row address signal, the first end power select circuit and second end power select circuits controllable impedance paths are selectable based on the logic level of the at least one row address signal.

18. The integrated circuit device of claim 16, further including:
a power supply detection circuit, the power supply detection circuit provides the assist enable signal having an assist logic level when the power supply potential is below an assist potential and provides the assist enable signal having an assist disable logic level when the power supply potential is greater than the assist potential.

19. The integrated circuit device of claim 1, wherein:
the integrated circuit device includes a processor circuit portion and a SRAM circuit portion, the processor portion and the SRAM portion are commonly powered by the power supply potential, the SRAM circuit portion includes the array of memory cells.

20. The integrated circuit device of claim 19, wherein:
the processor portion and the SRAM circuit portion are connected by a bus for carrying data between the processor portion and the SRAM circuit portion.

* * * * *